(12) United States Patent
Zhang et al.

(10) Patent No.: US 10,097,209 B2
(45) Date of Patent: Oct. 9, 2018

(54) INTERLEAVING AND MAPPING METHOD AND DEINTERLEAVING AND DEMAPPING METHOD FOR LDPC CODEWORD

(71) Applicant: Shanghai National Engineering Research Center of Digital Television Co., Ltd., Shanghai (CN)

(72) Inventors: Wenjun Zhang, Shanghai (CN); Yijun Shi, Shanghai (CN); Dazhi He, Shanghai (CN); Yunfeng Guan, Shanghai (CN); Yin Xu, Shanghai (CN); Xufeng Guo, Shanghai (CN)

(73) Assignee: Shanghai National Engineering Research Center of Digital Television Co., Ltd., Shanghai (CN)

( * ) Notice: Subject to any disclaimer, the term of this patent is extended or adjusted under 35 U.S.C. 154(b) by 48 days.

(21) Appl. No.: 15/242,412

(22) Filed: Aug. 19, 2016

(65) Prior Publication Data

US 2017/0230061 A1 Aug. 10, 2017

Related U.S. Application Data

(63) Continuation of application No. PCT/CN2015/073162, filed on Feb. 16, 2015.

(30) Foreign Application Priority Data

| Feb. 20, 2014 | (CN) | 2014 1 0058280 |
| May 22, 2014 | (CN) | 2014 1 0219204 |
| May 22, 2014 | (CN) | 2014 1 0219229 |

(51) Int. Cl.
*H03M 13/00* (2006.01)
*H03M 13/27* (2006.01)
(Continued)

(52) U.S. Cl.
CPC ... *H03M 13/2792* (2013.01); *H03M 13/1148* (2013.01); *H03M 13/6522* (2013.01);
(Continued)

(58) Field of Classification Search
CPC ............. H03M 13/27; H03M 13/1165; H03M 13/255; H03M 13/271; H03M 13/356;
(Continued)

(56) References Cited

U.S. PATENT DOCUMENTS

| 2015/0200747 A1* | 7/2015 | Petrov | H03M 13/19 |
| | | | 714/776 |
| 2016/0233891 A1* | 8/2016 | Myung | H04L 1/0041 |

(Continued)

FOREIGN PATENT DOCUMENTS

| CN | 101018105 A | 8/2007 |
| CN | 101043483 A | 9/2007 |

(Continued)

OTHER PUBLICATIONS

International Search Report for International Application No. PCT/CN2015/073162 with English translation.

*Primary Examiner* — Guerrier Merant
(74) *Attorney, Agent, or Firm* — Kilpatrick Townsend & Stockton LLP

(57) ABSTRACT

An interleaving and mapping method and a deinterleaving and demapping method for an LDPC codeword are provided. The interleaving and mapping method comprises: performing first bit interleaving on a check part of the LDPC codeword to obtain a check bit stream; splicing an information bit part of the codeword and the check bit stream into a codeword after the first bit interleaving; dividing the codeword after the first bit interleaving into multiple consecutive bit subblocks in a predetermined length, and changing the order of the bit subblocks according to a correspond- (Continued)

ing permutation order (bit-swapping pattern) to form a codeword after second bit interleaving; dividing the codeword after the second bit interleaving into two parts, and writing the two parts into storage space in a column order respectively and reading the two parts from the storage space in a row order respectively to obtain a codeword after third bit interleaving; and performing constellation mapping on the codeword after the third bit interleaving according to a constellation diagram to obtain a symbol stream; the permutation orders (bit-swapping patterns) and the constellation diagrams used in the interleaving and mapping processing of LDPC codes with different code rates, code length and LDPC code tables are designed and optimized using theoretical analysis. The technical solution reduces the receiving threshold of the receiving end.

44 Claims, 3 Drawing Sheets

(51) Int. Cl.
*H03M 13/11* (2006.01)
*H04L 1/00* (2006.01)
*H04L 27/34* (2006.01)
*H04L 27/18* (2006.01)

(52) U.S. Cl.
CPC .......... *H04L 1/0058* (2013.01); *H04L 1/0071* (2013.01); *H04L 27/18* (2013.01); *H04L 27/3405* (2013.01)

(58) Field of Classification Search
CPC .......... H03M 13/6552; H03M 13/116; H03M 13/296; H03M 13/2957; H03M 13/2792; H03M 13/6325; H03M 13/6508; H03M 13/1137; H03M 13/1185; H03M 13/2707; H04L 1/0061; H04L 1/0045
See application file for complete search history.

(56) References Cited

U.S. PATENT DOCUMENTS

| | | | |
|---|---|---|---|
| 2016/0233892 A1* | 8/2016 | Kim | H03M 13/1102 |
| 2016/0233983 A1* | 8/2016 | Jeong | H03M 13/1102 |
| 2016/0352362 A1* | 12/2016 | Fonseka | H03M 13/2906 |
| 2017/0163289 A1* | 6/2017 | Myung | H03M 13/1165 |
| 2017/0338992 A1* | 11/2017 | Baek | H04N 21/2383 |

FOREIGN PATENT DOCUMENTS

| | | |
|---|---|---|
| CN | 101047840 A | 10/2007 |
| CN | 101325474 A | 12/2008 |
| CN | 101399554 A | 4/2009 |
| CN | 101902230 A | 12/2010 |

* cited by examiner

```
                    ┌─────────────────────────────────────────┐
                    │ Dividing a check part in the LDPC       │ ── S11
                    │ codeword into a first check part and    │
                    │ a second check part                     │
                    └─────────────────────────────────────────┘
                                       │
                    ┌─────────────────────────────────────────┐
                    │ Performing first bit interleaving on    │ ── S12
                    │ the first check part and the second     │
                    │ check part to obtain a first check bit  │
                    │ stream and a second check bit           │
                    │ stream, respectively                    │
                    └─────────────────────────────────────────┘
                                       │
                    ┌─────────────────────────────────────────┐
                    │ Splicing an information bit part in     │ ── S13
                    │ the LDPC codeword and the first check   │
                    │ bit stream and the second check bit     │
                    │ stream into an LDPC codeword            │
                    │ after the first bit interleaving        │
                    └─────────────────────────────────────────┘
                                       │
                    ┌─────────────────────────────────────────┐
                    │ Dividing the LDPC codeword after the    │ ── S14
                    │ first bit interleaving into multiple    │
                    │ consecutive bit subblocks in a          │
                    │ predetermined length, and changing      │
                    │ the order of the bit subblocks          │
                    │ according to a corresponding            │
                    │ permutation order (bit-swapping         │
                    │ pattern) to form an LDPC codeword       │
                    │ after second bit interleaving           │
                    └─────────────────────────────────────────┘
                                       │
                    ┌─────────────────────────────────────────┐
                    │ Writing the LDPC codeword after the     │ ── S15
                    │ second bit interleaving into a storage  │
                    │ space in a column order and reading     │
                    │ the LDPC codeword after the second bit  │
                    │ interleaving from the storage space in  │
                    │ a row order to obtain an LDPC codeword  │
                    │ after third bit interleaving            │
                    └─────────────────────────────────────────┘
                                       │
                    ┌─────────────────────────────────────────┐
                    │ Performing constellation mapping on the │ ── S16
                    │ LDPC codeword after the third bit       │
                    │ interleaving according to a             │
                    │ corresponding constellation diagram to  │
                    │ obtain a symbol stream, wherein the     │
                    │ permutation order (bit-swapping         │
                    │ pattern) and the constellation diagram  │
                    │ both correspond to LDPC code tables     │
                    └─────────────────────────────────────────┘
```

Fig.1

INTERLEAVING AND MAPPING METHOD AND DEINTERLEAVING AND DEMAPPING METHOD FOR LDPC CODEWORD

TECHNICAL FIELD

The present invention relates to the technical field of digital televisions, in particular to an interleaving and mapping method and a deinterleaving and demapping method for an LDPC codeword.

BACKGROUND

In the existing broadcast communication standards, LDPC coding, bit interleaving and constellation mapping are the most common coding and modulation modes. In different transmitting systems, the LDPC coding, the bit interleaving and the constellation mapping all require independent design and joint adjustment to achieve the best performance. Therefore, it is a technical problem in the art as regards how to form targeted bit interleaving for different LDPC code words by designing a constellation mapping mode with good performance through theoretical analysis and optimization so as to reduce the receiving threshold of a receiving end.

SUMMARY OF THE INVENTION

The problem to be solved by the present invention is to reduce the receiving threshold of a receiving end.

In order to solve the above-mentioned problem, the embodiments of the present invention provide an interleaving and mapping method for an LDPC codeword, comprising the steps of:

performing first bit interleaving on a check part of the LDPC codeword to obtain a check bit stream;

splicing an information bit part of the LDPC codeword and the check bit stream into an LDPC codeword after the first bit interleaving;

dividing the LDPC codeword after the first bit interleaving into multiple consecutive bit subblocks with a predetermined bit length, and changing the order of the bit subblocks according to a corresponding permutation order (bit-swapping pattern) to form an LDPC codeword after second bit interleaving;

dividing the LDPC codeword after the second bit interleaving into two parts, writing a first part into a storage space in a column order and reading the first part from the storage space in a row order, then writing a second part into a storage space in a column order and reading the second part from the storage space in a row order, and splicing the two read results to obtain an LDPC codeword after third bit interleaving;

performing constellation mapping on the LDPC codeword after the third bit interleaving according to a corresponding constellation diagram to obtain a symbol stream; the permutation orders (bit-swapping patterns) and the constellation diagrams used in the interleaving and mapping processing of LDPC codes with different code rates, code length, and LDPC code tables are designed and optimized using theoretical analysis.

The embodiments of the present invention further provide a deinterleaving and demapping method for an LDPC codeword, which comprises the steps of:

soft-demapping symbol stream received by a receiving end according to a corresponding constellation diagram to obtain soft bit value data; wherein the symbol stream is generated by means of the interleaving and mapping method for an LDPC codeword;

dividing the soft bit value data into a first part and a second part and writing the two parts into a storage space in a row order respectively and reading the two parts from the storage space in a column order respectively, and splicing the two reading results to obtain soft bit value data after the first bit deinterleaving;

dividing the soft bit value data after the first bit deinterleaving into multiple consecutive soft bit value data subblocks with a predetermined length, and changing the order of the soft bit value data subblocks according to a corresponding permutation order (bit-swapping pattern) to form soft bit value data after second bit deinterleaving;

performing third bit deinterleaving on soft bit value data corresponding to a check part of the LDPC codeword after the second bit deinterleaving to obtain soft bit value data after the third bit deinterleaving;

splicing the soft bit value data corresponding to an information bit part of the LDPC codeword after the second bit deinterleaving and the soft bit value data after the third bit deinterleaving into a soft bit value data stream; and performing LDPC decoding on the soft bit value data stream to obtain decoded bit stream data.

Compared with the prior art, the technical solutions of the present invention have the following advantages:

for different code lengths, code rates and respective LDPC code tables, an interleaving and mapping method and a deinterleaving and demapping method with good performance is designed by means of theoretical analysis and optimization so as to reduce the receiving threshold of a receiving end, thereby well improving the system performance.

Furthermore, the embodiments of the present invention also provides a corresponding non-uniform 16QAM constellation diagram and bit interleaving pattern (permutation order) for an LDPC code table having a code rate of 4/15 and a code length of 64800, provides a corresponding non-uniform 16QAM constellation diagram and bit interleaving pattern (permutation order) for an LDPC code table having a code rate of 7/15 and a code length of 64800, provides a corresponding QPSK constellation diagram and bit interleaving pattern (permutation order) for an LDPC code table having a code rate of 4/15 and a code length of 16200, provides a corresponding QPSK constellation diagram and bit interleaving pattern (permutation order) for an LDPC code table having a code rate of 8/15 and a code length of 16200, provides a corresponding QPSK constellation diagram and bit interleaving pattern (permutation order) for an LDPC code table having a code rate of 11/15 and a code length of 16200, provides a corresponding QPSK constellation diagram and bit interleaving pattern (permutation order) for an LDPC code table having a code rate of 12/15 and a code length of 16200, and provides a corresponding a non-uniform 16QAM constellation diagram and bit interleaving pattern (permutation order) for an LDPC code table having a code rate of 8/15 and a code length of 16200, which can effectively reduce a receiving threshold of a receiving end in practice, thereby improving the system performance.

BRIEF DESCRIPTION OF THE DRAWINGS

FIG. 1 is a flow schematic diagram of a specific embodiment of an interleaving and mapping method for an LDPC codeword of the present invention;

DETAILED DESCRIPTION OF THE INVENTION

Figure 2:
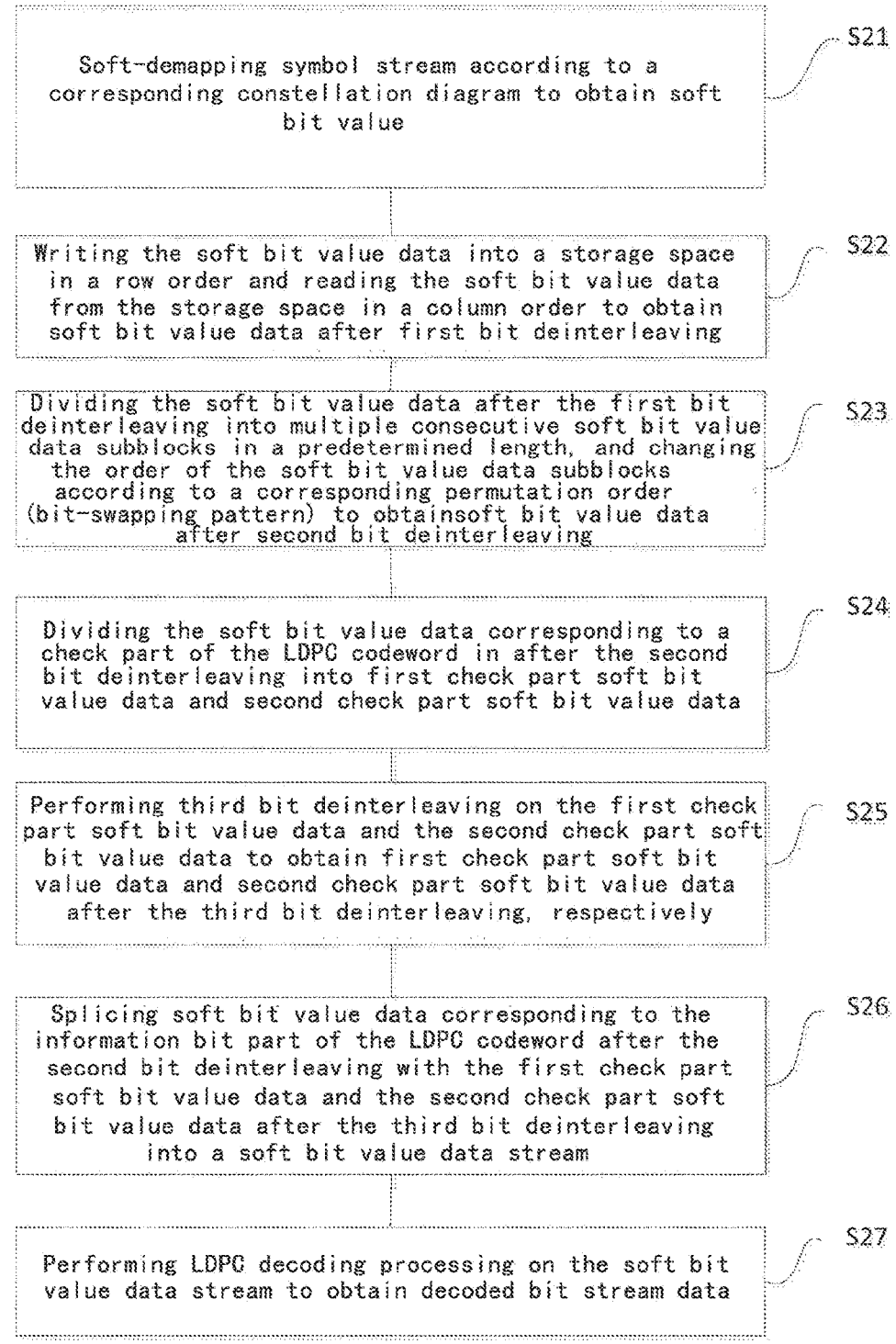
FIG. 2 is a flow schematic diagram of a specific embodiment of an deinterleaving and demapping method for an LDPC codeword of the present invention.

The inventor finds that, in the prior art, the technical solution formed between a constellation mapping mode and a bit interleaving pattern (permutation order) for a specific LDPC codeword does not reach the best performance.

With regard to the above-mentioned problem, the inventor provides an interleaving and mapping method and a deinterleaving and demapping method for an LDPC codeword through study, and designs an interleaving and mapping method and a deinterleaving and demapping method with good performance for different code rates and corresponding LDPC code tables by means of theoretical analysis and optimization, so as to reduce the receiving threshold of a receiving end, thereby well improving the system performance.

To make the above objects, features and advantages of the present invention more comprehensible, the present invention will be further described in detail below in conjunction with the accompanying drawings and particular embodiments.

In the embodiments of the present invention, a transmitter end: firstly inputs a bit stream after signal source coding and BCH coding into an LDPC coder to code an LDPC codeword with a specific code rate and code length, inputs the bit stream into a bit interleaver and interleaves the bit stream according to a specific bit interleaving pattern (permutation order) method, performs corresponding constellation mapping on data after the bit interleaving, and then modulates and transmits the data to pass through a channel. A receiver end: demodulates the data after the data passes through the channel, inputs the demodulated data into a demapping module for demapping, inputs soft bit value information output by the demapping module into a deinterleaving module for deinterleaving, outputs the deinterleaved soft bit value information to an LDPC decoder to decode same based on a specific LDPC codeword, and finally decodes and outputs the bit stream.

FIG. 1 shows a flow schematic diagram of a specific embodiment of the interleaving and mapping method for an LDPC codeword of the present invention. With reference to FIG. 1, an interleaving and mapping method for an LDPC codeword comprises the steps of:

step S11, performing first bit interleaving on a check part of the LDPC codeword to obtain a check bit stream;

step S12, splicing an information bit part of the LDPC codeword and the check bit stream into an LDPC codeword after the first bit interleaving;

step S13, dividing the LDPC codeword after the first bit interleaving into multiple consecutive bit subblocks with a predetermined bit length, and changing the order of the bit subblocks according to a corresponding permutation order (bit-swapping pattern) to form an LDPC codeword after second bit interleaving;

step S14, dividing the LDPC codeword after the second bit interleaving into two parts, writing a first part into a storage space in a column order and reading the first part from the storage space in a row order, then writing a second part into a storage space in a column order and reading the second part from the storage space in a row order, and splicing the two read results to obtain an LDPC codeword after third bit interleaving;

and step S15, performing constellation mapping on the LDPC codeword after the third bit interleaving according to a corresponding constellation diagram to obtain a symbol stream; the permutation orders (bit-swapping patterns) and the constellation diagrams used in the interleaving and mapping processing of LDPC codes with different code rates, code length, and LDPC code tables are designed and optimized using theoretical analysis.

Figure 3:
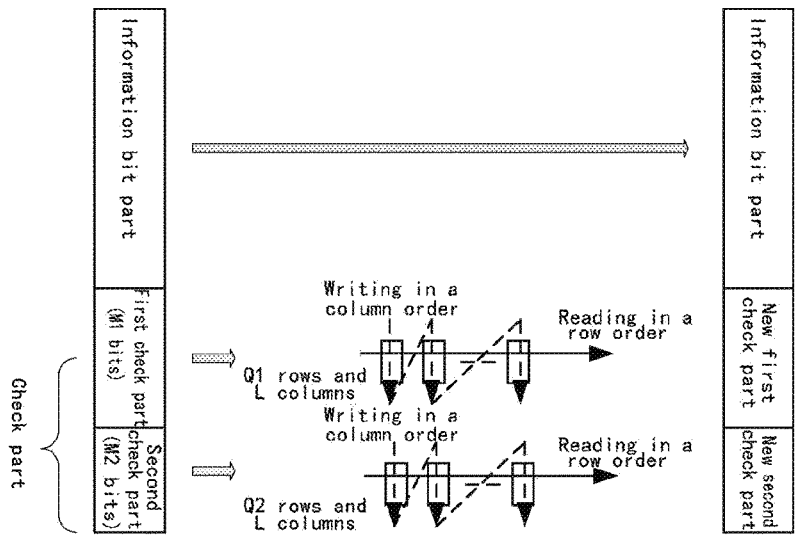
FIG. 3 is a schematic diagram of performing first bit interleaving on a check part in the LDPC codeword to obtain a check bit stream in an interleaving and mapping method for an LDPC codeword of the present invention.

In the present embodiment, the step S11 specifically comprises the steps of: performing bit interleaving on a check part of the generated LDPC codeword, wherein the check part of the LDPC codeword has $M_1+M_2$ bits in total, the first check part of $M_1$ bits are written into a storage space in columns with each column having $Q_1$ bits and there being L columns in total, that is $M_1=Q_1L$, and then the first check part is read in a row order; and the second check part of $M_2$ bits are written into a storage space in columns with each column having $Q_2$ bits and there being L columns in total, that is $M_2=Q_2L$ and then the second check part are read in a row order. Reference can be made to FIG. 3 for the specific implement process of the bit interleaving. When $M_2=0$ as in tables 4 to 6 shown below, it means that there is no second check part, and no interleaving is performed on the second check part. The length of M1 and M2 can be calculated from the code length, the code rate, the size of subblock and the LDPC code table.

Figure 4:
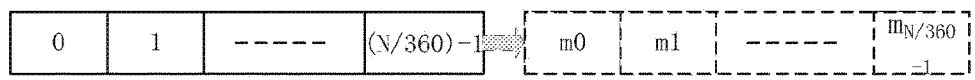
FIG. 4 is a schematic diagram of changing the order of the bit subblocks according to a bit-swapping pattern (permutation order) in an interleaving and mapping method for an LDPC codeword of the present invention.

In step S13, the LDPC codeword after the first bit interleaving is divided into multiple consecutive bit subblocks in a predetermined length, wherein the predetermined length is 360. Furthermore, the order of the bit subblocks is changed according to a corresponding bit-swapping pattern to form an LDPC codeword after second bit interleaving. The specific process thereof is as shown in FIG. 4. In FIG. 4, $(m_0, m_1, \ldots, m_{N/360-1})$ is a bit-swapping pattern (permutation order) of a bit subblock with the length of 360.

Specifically, for LDPC codewords with different code lengths and code rates, bit-swapping patterns (permutation orders) and constellation diagrams designed through theoretical analysis and optimization are provided.

1) The code length is 64800 and the code rate is 4/15

The corresponding bit-swapping pattern (permutation order) is:

165 8 136 2 58 30 127 64 38 164 123 45 78 17 47 105 159
134 124 147 148 109 67 98 157 57 156 170 46 12 172 29
9 3 144 97 83 151 26 52 10 39 50 104 92 163 72 125 36 14
55 48 1 149 33 110 6 130 140 89 77 22 171 139 112 113 152
16 7 85 11 28 153 73 62 44 135 116 4 61 117 53 111 178
94 81 68 114 173 75 101 88 65 99 126 141 43 15 18 90 35
24 142 25 120 19 154 0 174 93 167 150 107 86 129 175 87
21 66 106 82 179 118 41 95 145 37 23 168 166 49 103 108
56 91 69 128 121 96 133 100 161 143 119 102 59 20 40 70
79 80 51 13 177 131 132 176 155 31 63 5 162 76 42 160 115
71 158 54 137 146 32 169 122 138 84 74 60 34 27

It should be noted that in the present embodiment, various values in the bit-swapping pattern (permutation order) refer to the positions of the bit subblocks before bit swapping. For example, the first value 165 in the above-mentioned bit-swapping pattern means that the 166th bit subblock before bit swapping is now the first bit subblock after bit swapping.

The corresponding constellation diagram is a non-uniform 16-QAM:

| Constellation point | Complex symbol |
| --- | --- |
| 0 | 0.3412 + 0.5241i |
| 1 | 0.5241 + 0.3412i |
| 2 | 0.5797 + 1.1282i |
| 3 | 1.1282 + 0.5797i |
| 4 | −0.3412 + 0.5241i |
| 5 | −0.5241 + 0.3412i |
| 6 | −0.5797 + 1.1282i |
| 7 | −1.1282 + 0.5797i |
| 8 | 0.3412 − 0.5241i |
| 9 | 0.5241 − 0.3412i |
| 10 | 0.5797 − 1.1282i |
| 11 | 1.1282 − 0.5797i |
| 12 | −0.3412 − 0.5241i |
| 13 | −0.5241 − 0.3412i |
| 14 | −0.5797 − 1.1282i |
| 15 | −1.1282 − 0.5797i |

2) The code length is 64800 and the code rate is 7/15
The corresponding bit-swapping pattern is:
174 148 56 168 38 7 110 9 42 153 160 15 46 21 121 88 114 85 13 83 74 81 70 27 119 118 144 31 80 109 73 141 93 45 16 77 108 57 36 78 124 79 169 143 6 58 75 67 5 104 125 140 172 8 39 17 29 159 86 87 41 99 89 47 128 43 161 154 101 163 116 94 120 71 158 145 37 112 68 95 1 113 64 72 90 92 35 167 44 149 66 28 82 178 176 152 23 115 130 98 123 102 24 129 150 34 136 171 54 107 2 3 60 69 10 117 91 157 33 105 155 62 162 40 127 14 165 26 52 19 48 137 4 22 122 173 18 11 111 106 76 53 61 147 97 175 32 59 166 179 135 177 103 100 139 50 146 134 133 96 49 126 151 84 156 30 138 164 132 12 0 20 63 170 142 65 55 25 51 131
The corresponding constellation diagram is a non-uniform 16-QAM:

| Constellation point | Complex symbol |
| --- | --- |
| 0 | 0.2592 + 0.4888i |
| 1 | 0.4888 + 0.2592i |
| 2 | 0.5072 + 1.1980i |
| 3 | 1.1980 + 0.5072i |
| 4 | −0.2592 + 0.4888i |
| 5 | −0.4888 + 0.2592i |
| 6 | −0.5072 + 1.1980i |
| 7 | −1.1980 + 0.5072i |
| 8 | 0.2592 − 0.4888i |
| 9 | 0.4888 − 0.2592i |
| 10 | 0.5072 − 1.1980i |
| 11 | 1.1980 − 0.5072i |
| 12 | −0.2592 − 0.4888i |
| 13 | −0.4888 − 0.2592i |
| 14 | −0.5072 − 1.1980i |
| 15 | −1.1980 − 0.5072i |

3) The code length is 16200 and the code rate is 4/15
The corresponding bit-swapping pattern is:
0 2 4 6 8 10 12 14 16 18 20 22 24 26 28 30 32 34 36 38 40 42 1 3 5 7 9 11 13 15 17 19 21 23 25 27 29 31 33 35 37 39 41 43 44
The corresponding constellation diagram is QPSK:

| Constellation point | Complex symbol |
| --- | --- |
| 0 | 1 + i |
| 1 | 1 − i |
| 2 | −1 + i |
| 3 | −1 − i |

4) The code length is 16200 and the code rate is 8/15
The corresponding bit-swapping pattern is:
0 2 4 6 8 10 12 14 16 18 20 22 24 26 28 30 32 34 36 38 40 42 1 3 5 7 9 11 13 15 17 19 21 23 25 27 29 31 33 35 37 39 41 43 44
The corresponding constellation diagram is QPSK:

| Constellation point | Complex symbol |
| --- | --- |
| 0 | 1 + i |
| 1 | 1 − i |
| 2 | −1 + i |
| 3 | −1 − i |

5) The code length is 16200 and the code rate is 11/15
The corresponding bit-swapping pattern is QPSK:
0 2 4 6 8 10 12 14 16 18 20 22 24 26 28 30 32 34 36 38 40 42 1 3 5 7 9 11 13 15 17 19 21 23 25 27 29 31 33 35 37 39 41 43 44
The corresponding constellation diagram is:

| Constellation point | Complex symbol |
| --- | --- |
| 0 | 1 + i |
| 1 | 1 − i |
| 2 | −1 + i |
| 3 | −1 − i |

6) The code length is 16200 and the code rate is 12/15
The corresponding bit-swapping pattern is:
0 2 4 6 8 10 12 14 16 18 20 22 24 26 28 30 32 34 36 38 40 42 1 3 5 7 9 11 13 15 17 19 21 23 25 27 29 31 33 35 37 39 41 43 44
The corresponding constellation diagram is QPSK:

| Constellation point | Complex symbol |
| --- | --- |
| 0 | 1 + i |
| 1 | 1 − i |
| 2 | −1 + i |
| 3 | −1 − i |

7) The code length is 16200 and the code rate is 8/15
The corresponding bit-swapping pattern is:
36 5 22 26 1 13 3 33 9 6 23 20 35 10 17 41 30 15 21 42 29 11 37 4 2 38 44 0 18 19 8 31 28 43 14 34 32 25 40 12 16 24 39 27 7
The corresponding constellation diagram is a non-uniform 16-QAM:

| Constellation point | Complex symbol |
| --- | --- |
| 0 | 0.2535 + 0.4923i |
| 1 | 0.4923 + 0.2535i |

-continued

| Constellation point | Complex symbol |
|---|---|
| 2 | 0.4927 + 1.2044i |
| 3 | 1.2044 + 0.4927i |
| 4 | −0.2535 + 0.4923i |
| 5 | −0.4923 + 0.2535i |
| 6 | −0.4927 + 1.2044i |
| 7 | −1.2044 + 0.4927i |
| 8 | 0.2535 − 0.4923i |
| 9 | 0.4923 − 0.2535i |
| 10 | 0.4927 − 1.2044i |
| 11 | 1.2044 − 0.4927i |
| 12 | −0.2535 − 0.4923i |
| 13 | −0.4923 − 0.2535i |
| 14 | −0.4927 − 1.2044i |
| 15 | −1.2044 − 0.4927i |

In step S14, for example, an LDPC codeword (an LDPC codeword after second bit interleaving) having a code length of 16200 bits is divided into a first part and a second part, wherein the length of the first part is 15840 bits and the length of the second part is 360 bits, and the two parts are written into a storage space in a column order and are read from the storage space in a row order. Where QPSK constellation mapping is used, the first part has 7920 bits in each column and has two columns in total, and the second part has 180 bits in each column and has two columns in total. Where a non-uniform 16-QAM is used, the first part has 3960 bits in each column and has four columns in total, and the second part has 90 bits in each column and has four columns in total. An LDPC codeword (an LDPC codeword after second bit interleaving) having a code length of 64800 bits only has a first part, i.e. the length of the first part is 64800 bits and the length of the second part is 0 bits, and the two parts are written in a storage space in a column order and are read from the storage space in a row order. Where a non-uniform 16-QAM is used, there are 16200 bits in each column and there are four columns in total.

Afterwards, for the above-mentioned bit stream data ($b_0$, $b_1$, ..., $b_{N-1}$) after bit interleaving, in accordance with the constellation diagram, where the QPSK is used, a decimal number corresponding to every two binary bit sequences is mapped to a certain constellation point, and where a non-uniform 16-QAM is used, a decimal number corresponding to every four binary bit sequences is mapped to a certain constellation point, so that a symbol stream is obtained (each complex symbol corresponding to a constellation point). Taking a non-uniform 16-QAM corresponding to a code length of 64800 bits and a code rate of 7/15 as an example, four input bits '0110' correspond to a decimal number of 6, and then corresponds to a constellation point −0.5072+1.1980i in the constellation diagram, and the constellation point is displayed on a real number axis and a virtual number axis as −0.5072 on the real number axis and 1.1980 on the virtual number axis.

In the embodiment, the LDPC codeword is obtained by performing specific LDPC coding on the bit stream after signal source coding, wherein the specific LDPC coding can be implemented by the prior art.

No limit to give an example, choose a specific LDPC codeword from six LDPC codewords with subblock size of L×L (L=360) and LDPC code tables given as below:

TABLE 1 the code length is 64800 and the code rate is 4/15, L × L = 360 × 360
$M_1$ = 1800, $M_2$ = 45720, L × L = 360 × 360

276 1754 1780 3597 8549 15196 26305 27003 33883 37189 41042 41849 42356
730 873 927 9310 9867 17594 21969 25106 25922 31167 35434 37742 45866
925 1202 1564 2575 2831 2951 5193 13096 18363 20592 33786 34090 40900
973 1045 1071 8545 8980 11983 18649 21323 22789 22843 26821 36720 37856
402 1038 1689 2466 2893 13474 15710 24137 29709 30451 35568 35966 46436
263 271 395 5089 5645 15488 16314 28778 29729 34350 34533 39608 45371
387 1059 1306 1955 6990 20001 24606 28167 33802 35181 38481 38688 45140
53 851 1750 3493 11415 18882 20244 23411 28715 30722 36487 38019 45416
810 1044 1772 3906 5832 16793 17333 17910 23946 29650 34190 40673 45828
97 491 948 12156 13788 24970 33774 37539 39750 39820 41195 46464 46820
192 899 1283 3732 7310 13637 13810 19005 24227 26772 31273 37665 44005
424 531 1300 4860 8983 10137 16323 16888 17933 22458 26917 27835 37931
130 279 731 3024 6378 18838 19746 21007 22825 23109 28644 32048 34667
938 1041 1482 9589 10065 11535 17477 25816 27966 35022 35025 42536
170 454 1312 5326 6765 23408 24090 26072 33037 38088 42985 46413
220 804 843 2921 4841 7760 8303 11259 21058 21276 34346 37604
676 713 832 11937 12006 12309 16329 26438 34214 37471 38179 42420
714 931 1580 6837 9824 11257 15556 26730 32053 34461 35889 45821
28 1097 1340 8767 9406 17253 29558 32857 37856 38593 41781 47101
158 722 754 14489 23851 28160 30371 30579 34963 44216 46462 47463
833 1326 1332 7032 9566 11011 21424 26827 29789 31699 32876 37498
251 504 1075 4470 7736 11242 20397 32719 34453 36571 40344 46341
330 581 868 15168 20265 26354 33624 35134 38609 44965 45209 46909
729 1643 1732 3946 4912 9615 19699 30993 33658 38712 39424 46799
546 982 1274 9264 11017 11868 15674 16277 19204 28606 39063 43331
73 1160 1196 4334 12560 13583 14703 18270 18719 19327 38985 46779
1147 1625 1759 3767 5912 11599 18561 19330 29619 33671 43346 44098
104 1507 1586 9387 17890 23532 27008 27861 30966 33579 35541 39801
1700 1746 1793 4941 7814 13746 20375 27441 30262 30392 35385 42848
183 555 1029 3090 5412 8148 19662 23312 23933 28179 29962 35514
891 908 1127 2827 4077 4376 4570 26923 27456 33699 43431 46071
404 1110 1782 6003 14452 19247 26998 30137 31404 31624 46621 47366
886 1627 1704 8193 8980 9648 10928 16267 19774 35111 38545 44735
268 380 1214 4797 5168 9109 9288 17992 21309 33210 36210 41429
572 1121 1165 6944 7114 20978 23540 25863 26190 26365 41521 44690
18 185 496 5885 6165 20468 23895 24745 31226 33680 37665 38587
289 527 1118 11275 12015 18088 22805 24679 28262 30160 34892 43212
658 926 1589 7634 16231 22193 25320 26057 26512 27498 29472 34219
337 801 1525 2023 3512 16031 26911 32719 35620 39035 43779 44316
248 534 670 6217 11430 24090 26509 28712 33073 33912 38048 39813
82 1556 1575 7879 7892 14714 22404 22773 25531 34170 38203 38254
247 313 1224 3694 14304 24033 26394 28101 37455 37859 38997 41344
790 887 1418 2811 3288 9049 9704 13303 14262 38149 40109 40477
1310 1384 1471 3716 8250 25371 26329 26997 30138 40842 41041 44921
86 288 367 1860 8713 18211 22628 22811 28342 28463 40415 45845
719 1438 1741 8258 10797 29270 29404 32096 34433 34616 36030 45597

TABLE 1-continued the code length is 64800 and the code rate is 4/15, L × L = 360 × 360
$M_1 = 1800, M_2 = 45720, L \times L = 360 \times 360$ 215 1182 1364 8146 9949 10498 18603 19304 19803 23685 43304 45121
1243 1496 1537 8484 8851 16589 17665 20152 24283 28993 34274 39795
6320 6785 15841 16309 20512 25804 27421 28941 43871 44647
2207 2713 4450 12217 16506 21188 23933 28789 38099 42392
14064 14307 14599 14866 17540 18881 21065 25823 30341 36963
14259 14396 17037 26769 29219 29319 31689 33013 35631 37319
7798 10495 12868 14298 17221 23344 31908 39809 41001 41965

TABLE 2 the code length is 64800 and the code rate is 7/15, L × L = 360 × 360
$M_1 = 1080, M_2 = 33480, L \times L = 360 \times 360$ 460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281
683 709 1032 3787 17623 24138 26775 31432 33626
524 792 1042 12249 14765 18601 25811 32422 33163
137 639 688 7182 8169 10443 22530 24597 29039
159 643 749 16386 17401 24135 28429 33468 33469
107 481 555 7322 13234 19344 23498 26581 31378
249 389 523 3421 10150 17616 19085 20545 32069
395 738 1045 2415 3005 3820 19541 23543 31068
27 293 703 1717 3460 8326 8501 10290 32625
126 247 515 6031 9549 10643 22067 29490 34450
331 471 1007 3020 3922 7580 23358 28620 30946

TABLE 2-continued the code length is 64800 and the code rate is 7/15, L × L = 360 × 360
$M_1 = 1080, M_2 = 33480, L \times L = 360 \times 360$ 222 542 1021 3291 3652 13130 16349 33009 34348
532 719 1038 5891 7528 23252 25472 31395 31774
145 398 774 7816 13887 14936 23708 31712 33160
88 536 600 1239 1887 12195 13782 16726 27998
151 269 585 1445 3178 3970 15568 20358 21051
650 819 865 15567 18546 25571 32038 33350 33620
93 469 800 6059 10405 12296 17515 21354 22231
97 206 951 6161 16376 27022 29192 30190 30665
412 549 986 5833 10583 10766 24946 28878 31937
72 604 659 5267 12227 21714 32120 33472 33974
25 902 912 1137 2975 9642 11598 25919 28278
420 976 1055 8473 11512 20198 21662 25443 30119
1 24 932 6426 11899 13217 13935 16548 29737
53 618 988 6280 7267 11676 13575 15532 25787
111 739 809 8133 12717 12741 20253 20608 27850
120 683 943 14496 15162 15440 18660 27543 32404
600 754 1055 7873 9679 17351 27268 33508
344 756 1054 7102 7193 22903 24720 27883
582 1003 1046 11344 23756 27497 27977 32853
28 429 509 11106 11767 12729 13100 31792
131 555 907 5113 10259 10300 20580 23029
406 915 977 12244 20259 26616 27899 32228
46 195 224 1229 4116 10263 13608 17830
19 819 953 7965 9998 13959 30580 30754
164 1003 1032 12920 15975 16582 22624 27357
8433 11894 13531 17675 25889 31384
3166 3813 8596 10368 25104 29584
2466 8241 12424 13376 24837 32711

TABLE 3 the code length is 16200 and the code rate is 4/15, L × L = 360 × 360
$M1 = 1080, M2 = 10800, L \times L = 360 \times 360$ 19 585 710 3241 3276 3648 6345 9224 9890 10841
181 494 894 2562 3201 4382 5130 5308 6493 10135
150 569 919 1427 2347 4475 7857 8904 9903
1005 1018 1025 2933 3280 3946 4049 4166 5209
420 554 778 6908 7959 8344 8462 10912 11099
231 506 859 4478 4957 7664 7731 7908 8980
179 537 979 3717 5092 6315 6883 9353 9935
147 205 830 3609 3720 4667 7441 10196 11809
60 1021 1061 1554 4918 5690 6184 7986 11296
145 719 768 2290 2919 7272 8561 9145 10233
388 590 852 1579 1698 1974 9747 10192 10255
231 343 485 1546 3155 4829 7710 10394 11336
4381 5398 5987 9123 10365 11018 11153
2381 5196 6613 6844 7357 8732 11082
1730 4599 5693 6318 7626 9231 10663

TABLE 4 a code length is 16200 and the code rate is 8/15, L × L = 360 × 360
$M1 = 7560, M2 = 0, L \times L = 360 \times 360$ 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412
81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554
105 975 3421 3480 4120 4444 5957 5971 6119 6617 6761 6810 7067 7353
6 138 485 1444 1512 2615 2990 3109 5604 6435 6513 6632 6704 7507
20 858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018
1285 1863 5324
3075 6005 6466

TABLE 4-continued a code length is 16200 and the code rate is 8/15, L × L = 360 × 360
M1 = 7560, M2 = 0, L × L = 360 × 360

5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559

TABLE 5 a code length is 16200 and the code rate is 11/15, L × L = 360 × 360
M1 = 4320, M2 = 0, L × L = 360 × 360

49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401

TABLE 6 a code length is 16200 and the code rate is 12/15, L × L = 360 × 360
M1 = 3240, M2 = 0, L × L = 360 × 360

3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207

TABLE 6-continued a code length is 16200 and the code rate is 12/15, L × L = 360 × 360
M1 = 3240, M2 = 0, L × L = 360 × 360

1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060

For example, the encoding procedures for the LDPC codewords described by LDPC code tables 1 to 3 are illustrated as below.

splitting the bit stream after the signal source coding into individual information blocks, each of the information block being composed of K information bits, denoted as $S=(s_0, s_1, \ldots, s_{K-1})$. Based on the specific LDPC coding in FIG. 1, $M_1+M_2$ check bits $P=(p_0, p_1, \ldots, p_{M_1+M_2-1})$ are generated according to $S=(s_0, s_1, \ldots, s_{K-1})$. Namely, an N-bit codeword $\Lambda=(\lambda_0, \lambda_1, \ldots, \lambda_{N-1})$ is obtained, where $N=K+M_1+M_2$. $\Lambda$ can also be represented as $\Lambda=(s_0, s_1, \ldots, s_{K-1}, p_0, p_1, \ldots, p_{M_1+M_2-1})$.

The steps of coding are:

1) Initializing $\lambda_i=s_i$, $i=0, 1, \ldots, K-1$. $p_j=0$, $j=0, 1, \ldots, M_1+M_2-1$ 2) For information bits $\lambda_0$, check bits taking the first row of numbers in the code table as addresses are accumulated, taking table 2, the code table with a code rate of 7/15 and a code length of 64800 as an example:

since the first row of numbers of the code table are:

460 792 1007 4580 11452 13130 26882 27020 32439

$p_{460}=p_{460}\oplus\lambda_0$, $p_{792}=p_{792}\oplus\lambda_0$, $p_{1007}=p_{1007}\oplus\lambda_0$, $p_{4580}=p_{4580}\oplus\lambda_0$, $p_{11452}=p_{11452}\oplus\lambda_0$, $p_{13130}=p_{13130}\oplus\lambda_0$, $p_{26882}=p_{26882}\oplus\lambda_0$, $p_{27020}=p_{27020}\oplus\lambda_0$, $p_{32439}=p_{32439}\oplus\lambda_0$ 3) For the next L−1 information bits, (L=360), $\lambda_m$, $m=1, 2, \ldots, L-1$, each of the information bits is respectively accumulated with check bits taking the following y as addresses:

$$y = \begin{cases} (x+mQ_1) \bmod M_1 & x < M_1 \\ M_1 + \{(x-M_1+mQ_2) \bmod M_2\} & x \geq M_1 \end{cases}$$

where x refers to check bit addresses related to $\lambda_0$, taking table 2 as an example, x is the first row of numbers in the code table, 460 792 1007 4580 11452 13130 26882 27020 32439, Moreover, $$Q_1 = \frac{M_1}{L} \text{ and } Q_2 = \frac{M_2}{L}.$$

Taking codewords of table 2 as an example, $$Q_1 = \frac{M_1}{L} = \frac{1080}{360} = 3,$$

$$Q_2 = \frac{M_2}{L} = \frac{33480}{360} = 93.$$

$p_{463}=p_{463}\oplus\lambda_1$, $p_{795}=p_{795}\oplus\lambda_1$, $p_{1010}=p_{1010}\oplus\lambda_1$, $p_{4673}=p_{4673}\oplus\lambda_1$, $p_{11545}=p_{11545}\oplus\lambda_0$, $p_{13223}=p_{13223}\oplus\lambda_1$, $p_{26975}=p_{26975}\oplus\lambda_1$, $p_{27113}=p_{27113}\oplus\lambda_1$, $p_{32532}=p_{32532}\oplus\lambda_1$ 4) For the Lth information bit $\lambda_L$, check bits are accumulated according to the second row of numerical addresses in the code table. Similarly, for the next L−1 information bits, check bits are continuously accumulated according to a formula in step 3), and at this time, x of the formula in step 3 is namely the second row of numbers in the code table.

5) Similarly, for the 2Lth, the 3Lth, the 4Lth, . . . , the iLth information bit, the check bits are accumulated according to addresses of the 3rd, 4th, 5th, . . . , (i+1)Lth row in the code table respectively, and for L−1 information bits following the information bits, the check bits are accumulated according to the formula in step 3) respectively. It should be noted that at this time, x of the formula of step 3 correspond to the row of the code table corresponding to the current iLth information bit, for example, the address of x corresponding to the L−1th bit following the iLth information bit is the (i+1)th row of the code table when the formula of step 3) is used.

6) After step 5) is completed, the following operations are performed:

$p_i=p_i\oplus p_{i-1}$ where $i=1,2, \ldots, M_i-1$

The embodiment of the present invention further provides a deinterleaving and demapping method for an LDPC codeword. FIG. 2 shows a flow schematic diagram of a specific embodiment of a deinterleaving and demapping method for an LDPC codeword of the present invention. With reference to FIG. 2, a deinterleaving and demapping method for an LDPC codeword comprises the steps of:

step S21, soft-demapping symbol stream received by a receiving end according to a corresponding constellation diagram to obtain soft bit value data; wherein the symbol stream is generated by means of the interleaving and mapping method for an LDPC codeword;

step S22, dividing the soft bit value data into a first part and a second part and writing the two parts into a storage space in a row order respectively and reading the two parts from the storage space in a column order respectively, and splicing the two reading results to obtain soft bit value data after the first bit deinterleaving;

step S23, dividing the soft bit value data after the first bit deinterleaving into multiple consecutive soft bit value data subblocks with a predetermined length, and changing the order of the soft bit value data subblocks according to a corresponding permutation order (bit-swapping pattern) to form soft bit value data after second bit deinterleaving;

step S24, dividing the soft bit value data in the soft bit value data after the second bit deinterleaving corresponding to the check part in the LDPC codeword into first check part soft bit value data and second check part soft bit value data;

step S25, respectively performing third bit deinterleaving on the first check part soft bit value data and the second check part soft bit value data to obtain first check part soft bit value data and second check part soft bit value data after the third bit deinterleaving;

step S26, splicing soft bit value data of the soft bit value data after the second bit deinterleaving corresponding to the information bit part in the LDPC codeword with the first check part soft bit value data and the second check part soft bit value data after the third bit deinterleaving into a soft bit value data stream;

and step S27, performing LDPC decoding on the soft bit value data stream to obtain decoded bit stream data.

In the present embodiment, the sizes of the first part and the second part and the corresponding storage space in step S22 respectively correspond to the sizes of the first part and the second part and the corresponding storage space in step S14 of FIG. 1 on a one-to-one basis.

The predetermined length and the bit-swapping pattern in step S23 correspond to the predetermined length and the bit-swapping pattern in step S13 of FIG. 1.

The first check part soft bit value data and the second check part soft bit value data in step S24 respectively correspond to the first part check bit and the second part check bit in step S11 of FIG. 1.

Step S25 specifically comprises: respectively writing the first check part soft bit value data and the second check part soft bit value data into a storage space in a row order and reading the first check part soft bit value data and the second check part soft bit value data from the storage space in a column order to obtain first check part soft bit value data and second check part soft bit value data after third bit deinterleaving, wherein the size of the storage space corresponds to the size of the storage space in step S11 of FIG. 1.

The present invention has been disclosed above with the preferred embodiments which, however, are not intended to limit the present invention, and any person skilled in the art could make possible changes and alterations to the technical solutions of the present invention using the disclosed method and technical contents described above without departing from the spirit and scope of the present invention. Therefore, any simple alteration, equivalent change and modification which are made to the above-mentioned embodiments in accordance with the technical substance of the present invention and without departing from the contents of the present invention, will fall within the scope of protection of the technical solutions of the present invention.

The invention claimed is:

1. An improved method of interleaving and mapping for a first LDPC codeword with a processsor, comprising the steps of:

performing, with the processor, first bit interleaving on a check part of the first LDPC codeword to obtain a check bit stream, wherein:
  the check part of the first LDPC codeword includes a first part having M1 bits and a second part having M2 bits; and
  the first bit interleaving is performed separately on the first part and the second part;

splicing, with the processor, an information bit part of the first LDPC codeword and the check bit stream into a second LDPC codeword after first bit interleaving;

dividing, with the processor, the second LDPC codeword after the first bit interleaving into multiple consecutive bit subblocks with a predetermined bit length, and changing the order of the bit subblocks according to a corresponding permutation order (bit-swapping pattern) to form a third LDPC codeword after second bit interleaving;

dividing, with the processor, the third LDPC codeword after the second bit interleaving into two parts, writing a first part into a storage space in a column order and reading the first part from the storage space in a row order, then writing a second part into a storage space in a column order and reading the second part from the storage space in a row order, and splicing the two read results to obtain fourth LDPC codeword after third bit interleaving; and performing, with the processor, constellation mapping on the fourth LDPC codeword after the third bit interleaving according to a corresponding constellation diagram to obtain a symbol stream; the permutation orders (bit-swapping patterns) and the constellation diagrams used in the interleaving and mapping processing of LDPC codes with different code rates, code length, and LDPC code tables are designed and optimized using theoretical analysis.

2. The improved method of interleaving and mapping for an LDPC codeword of claim 1, characterized in that performing first bit interleaving on a check part of the LDPC codeword to obtain a check bit stream comprises:

the first part $M_1$ bits written into a storage space in columns, with each column having $$Q_1 = \frac{M_1}{360}$$

bits and there being L=360 columns in total, and then the first part $M_1$ bits read in a row order; and the second part $M_2$ bits written into a storage space in columns, with each column having $$Q_2 = \frac{M_2}{360}$$

bits and there being L=360 columns in total, and then the second part $M_2$ bits read in a row order, so that the check bit stream is obtained.

3. The improved method of interleaving and mapping for an LDPC codeword of claim 1, characterized in that the predetermined bit length of the bit subblock is 360 bits.

4. The improved method of interleaving and mapping for an LDPC codeword of claim 1, characterized in that the LDPC code table corresponds to the LDPC code with a code length of 64800 bits and a code rate of 4/15;

the LDPC code table is:
33210 36210 41429 572 1121 1165 6944 7114 20978 23540 25863 26190 26365 41521 44690 18 185 496 5885 6165 20468 23895 24745 31226 33680 37665 38587 289 527 1118 11275 12015 18088 22805 24679 28262 30160 34892 43212 658 926 1589 7634 16231 22193 25320 26057 26512 27498 29472 34219 337 801 1525 2023 3512 16031 26911 32719 35620 39035 43779 44316 248 534 670 6217 11430 24090 26509 28712 33073 33912 38048 39813 82 1556 1575 7879 7892 14714 22404 22773 25531 34170 38203 38254 247 313 1224 3694 14304 24033 26394 28101 37455 37859 38997 41344 790 887 1418 2811 3288 9049 9704 13303 14262 38149 40109 40477 1310 1384 1471 3716 8250 25371 26329 26997 30138 40842 41041 44921 86 288 367 1860 8713 18211 22628 22811 28342 28463 40415 45845 719 1438 1741 8258 10797 29270 29404 32096 34433 34616 36030 45597 215 1182 1364 8146 9949 10498 18603 19304 23685 43304 45121 1243 1496 1537 8484 8851 16589 17665 20152 24283 28993 34274 39795 6320 6785 15841 16309 20512 25804 27421 28941 43871 44647 2207 2713 4450 12217 16506 21188 23933 28789 38099 42392 14064 14307 14599 14866 17540 18881 21065 25823 30341 36963 14259 14396 17037 26769 29219 29319 31689 33013 35631 37319 7798 10495 12868 14298 17221 23344 31908 39809 41001 41965 the corresponding permutation order (bit-swapping pattern) is:
165 8 136 2 58 30 127 64 38 164 123 45 78 17 47 105 159 134 124 147 148 109 67 98 157 57 156 170 46 12 172 29 9 3 144 97 83 151 26 52 10 39 50 104 92 163 72 125 36 14 55 48 1 149 33 110 6 130 140 89 77 22 171 139 112 113 152 16 7 85 11 28 153 73 62 44 135 116 4 61 117 53 111 178 94 81 68 114 173 75 101 88 65 99 126 141 43 15 18 90 35 24 142 25 120 19 154 0 174 93 167 150 107 86 129 175 87 21 66 106 82 179 118 41 95 145 37 23 168 166 49 103 108 56 91 69 128 121 96 133 100 161 143 119 102 59 20 40 70 79 80 51 13 177 131 132 176 155 31 63 5 162 76 42 160 115 71 158 54 137 146 32 169 122 138 84 74 60 34 27 and the corresponding constellation diagram is a non-uniform 16-QAM:

Constellation point Complex symbol 0 0.3412+0.5241i 1 0.5241+0.3412i 2 0.5797+1.1282i 3 1.1282+0.5797i 4 0.3412+0.5241i 5 0.5241+0.3412i 6−0.5797+1.1282i 7−1.1282+0.5797i 8 0.3412−0.5241i 9 0.5241−

M1=1800, M2=45720, L×L=360×360 276 1754 1780 3597 8549 15196 26305 27003 33883 37189 41042 41849 42356 730 873 927 9310 9867 17594 21969 25106 25922 31167 35434 37742 45866 925 1202 1564 2575 2831 2951 5193 13096 18363 20592 33786 34090 40900 973 1045 1071 8545 8980 11983 18649 21323 22789 22843 26821 36720 37856 402 1038 1689 2466 2893 13474 15710 24137 29709 30451 35568 35966 46436 263 271 395 5089 5645 15488 16314 28778 29729 34350 34533 39608 45371 387 1059 1306 1955 6990 20001 24606 28167 33802 35181 38481 38688 45140 53 851 1750 3493 11415 18882 20244 23411 28715 30722 36487 38019 45416 810 1044 1772 3906 5832 16793 17333 17910 23946 29650 34190 40673 45828 97 491 948 12156 13788 24970 33774 37539 39750 39820 41195 46464 46820 192 899 1283 3732 7310 13637 13810 19005 24227 26772 31273 37665 44005 424 531 1300 4860 8983 10137 16323 16888 17933 22458 26917 27835 37931 130 279 731 3024 6378 18838 19746 21007 22825 23109 28644 32048 34667 938 1041 1482 9589 10065 11535 17477 25816 27966 35022 35025 42536 170 454 1312 5326 6765 23408 24090 26072 33037 38088 42985 46413 220 804 843 2921 4841 7760 8303 11259 21058 21276 34346 37604 676 713 832 11937 12006 12309 16329 26438 34214 37471 38179 42420 714 931 1580 6837 9824 11257 15556 26730 32053 34461 35889 45821 28 1097 1340 8767 9406 17253 29558 32857 37856 38593 41781 47101 158 722 754 14489 23851 28160 30371 30579 34963 44216 46462 47463 833 1326 1332 7032 9566 11011 21424 26827 29789 31699 32876 37498 251 504 1075 4470 7736 11242 20397 32719 34453 36571 40344 46341 330 581 868 15168 20265 26354 33624 35134 38609 44965 45209 46909 729 1643 1732 3946 4912 9615 19699 30993 33658 38712 39424 46799 546 982 1274 9264 11017 11868 15674 16277 19204 28606 39063 43331 73 1160 1196 4334 12560 13583 14703 18270 18719 19327 38985 46779 1147 1625 1759 3767 5912 11599 18561 19330 29619 33671 43346 44098 104 1507 1586 9387 17890 23532 27008 27861 30966 33579 35541 39801 1700 1746 1793 4941 7814 13746 20375 27441 30262 30392 35385 42848 183 555 1029 3090

5412 8148 19662 23312 23933 28179 29962 35514
891 908 1127 2827 4077 4376 4570 26923 27456
33699 43431 46071 404 1110 1782 6003 14452 19247
26998 30137 31404 31624 46621 47366 886 1627
1704 8193 8980 9648 10928 16267 19774 35111
38545 44735 268 380 1214 4797 5168 9109 9288
17992 21309 0.3412i 10 0.5797−1.1282i 11 1.1282−
0.5797i 12−0.3412−0.5241i 13−0.5241−0.3412i
14−0.5797−1.1282i 15−1.1282−0.5797i.

5. The improved method of interleaving and mapping for an LDPC codeword of claim 1, characterized in that the LDPC code table corresponds to the LDPC code with a code length of 64800 bits and a code rate of 7/15;

the LDPC code table is:

M1=1080, M2=33480, L×L=360×360 460 792 1007 4580
11452 13130 26882 27020 32439 35 472 1056 7154
12700 13326 13414 16828 19102 45 440 772 4854
7863 26945 27684 28651 31875 744 812 892 1509
9018 12925 14140 21357 25106 271 474 761 4268
6706 9609 19701 19707 24870 223 477 662 1987 9247
18376 22148 24948 27694 44 379 786 8823 12322
14666 16377 28688 29924 104 219 562 5832 19665
20615 21043 22759 32180 41 43 870 7963 13718
14136 17216 30470 33428 592 744 887 4513 6192
18116 19482 25032 34095 456 821 1078 7162 7443
8774 15567 17243 33085 151 666 977 6946 10358
11172 18129 19777 32234 236 793 870 2001 6805
9047 13877 30131 34252 297 698 772 3449 4204
11608 22950 26071 27512 202 428 474 3205 3726
6223 7708 20214 25283 139 719 915 1447 2938 11864
15932 21748 28598 135 853 902 3239 18590 20579
30578 33374 34045 9 13 971 11834 13642 17628
21669 24741 30965 344 531 730 1880 16895 17587
21901 28620 31957 7 192 380 3168 3729 5518 6827
20372 34168 28 521 681 4313 7465 14209 21501
23364 25980 269 393 898 3561 11066 11985 17311
26127 30309 42 82 707 4880 4890 9818 23340 25959
31695 189 262 707 6573 14082 22259 24230 24390
24664 383 568 573 5498 13449 13990 16904 22629
34203 585 596 820 2440 2488 21956 28261 28703
29591 755 763 795 5636 16433 21714 23452 31150
34545 23 343 669 1159 3507 13096 17978 24241
34321 316 384 944 4872 8491 18913 21085 23198
24798 64 314 765 3706 7136 8634 14227 17127 23437
220 693 899 8791 12417 13487 18335 22126 27428
285 794 1045 8624 8801 9547 19167 21894 32657 386
621 1045 1634 1882 3172 13686 16027 22448 95 622
693 2827 7098 11452 14112 18831 31308 446 813 928
7976 8935 13146 27117 27766 33111 89 138 241 3218
9283 20458 31484 31538 34216 277 420 704 9281
12576 12788 14496 15357 20585 141 643 758 4894
10264 15144 16357 22478 26461 17 108 160 13183
15424 17939 19276 23714 26655 109 285 608 1682
20223 21791 24615 29622 31983 123 515 622 7037
13946 15292 15606 16262 23742 264 565 923 6460
13622 13934 23181 25475 26134 202 548 789 8003
10993 12478 16051 25114 27579 121 450 575 5972
10062 18693 21852 23874 28031 507 560 889 12064
13316 19629 21547 25461 28732 664 786 1043 9137
9294 10163 23389 31436 34297 45 830 907 10730
16541 21232 30354 30605 31847 203 507 1060 6971
12216 13321 17861 22671 29825 369 881 952 3035
12279 12775 17682 17805 34281 683 709 1032 3787
17623 24138 26775 31432 33626 524 792 1042 12249
14765 18601 25811 32422 33163 137 639 688 7182
8169 10443 22530 24597 29039 159 643 749 16386
17401 24135 28429 33468 33469 107 481 555 7322
13234 19344 23498 26581 31378 249 389 523 3421
10150 17616 19085 20545 32069 395 738 1045 2415
3005 3820 19541 23543 31068 27 293 703 1717 3460
8326 8501 10290 32625 126 247 515 6031 9549 10643
22067 29490 34450 331 471 1007 3020 3922 7580
23358 28620 30946 222 542 1021 3291 3652 13130
16349 33009 34348 532 719 1038 5891 7528 23252
25472 31395 31774 145 398 774 7816 13887 14936
23708 31712 33160 88 536 600 1239 1887 12195
13782 16726 27998 151 269 585 1445 3178 3970
15568 20358 21051 650 819 865 15567 18546 25571
32038 33350 33620 93 469 800 6059 10405 12296
17515 21354 22231 97 206 951 6161 16376 27022
29192 30190 30665 412 549 986 5833 10583 10766
24946 28878 31937 72 604 659 5267 12227 21714
32120 33472 33974 25 902 912 1137 2975 9642 11598
25919 28278 420 976 1055 8473 11512 20198 21662
25443 30119 1 24 932 6426 11899 13217 13935 16548
29737 53 618 988 6280 7267 11676 13575 15532
25787 111 739 809 8133 12717 12741 20253 20608
27850 120 683 943 14496 15162 15440 18660 27543
32404 600 754 1055 7873 9679 17351 27268 33508
344 756 1054 7102 7193 22903 24720 27883 582 1003
1046 11344 23756 27497 27977 32853 28 429 509
11106 11767 12729 13100 31792 131 555 907 5113
10259 10300 20580 23029 406 915 977 12244 20259
26616 27899 32228 46 195 224 1229 4116 10263
13608 17830 19 819 953 7965 9998 13959 30580
30754 164 1003 1032 12920 15975 16582 22624
27357 8433 11894 13531 17675 25889 31384 3166
3813 8596 10368 25104 29584 2466 8241 12424
13376 24837 32711 the corresponding permutation order (bit-swapping pattern) is:

174 148 56 168 38 7 110 9 42 153 160 15 46 21 121 88
114 85 13 83 74 81 70 27 119 118 144 31 80 109 73
141 93 45 16 77 108 57 36 78 124 79 169 143 6 58 75
67 5 104 125 140 172 8 39 17 29 159 86 87 41 99 89
47 128 43 161 154 101 163 116 94 120 71 158 145 37
112 68 95 1 113 64 72 90 92 35 167 44 149 66 28 82
178 176 152 23 115 130 98 123 102 24 129 150 34 136
171 54 107 2 3 60 69 10 117 91 157 33 105 155 62 162
40 127 14 165 26 52 19 48 137 4 22 122 173 18 11 111
106 76 53 61 147 97 175 32 59 166 179 135 177 103
100 139 50 146 134 133 96 49 126 151 84 156 30 138
164 132 12 0 20 63 170 142 65 55 25 51 131 and the corresponding constellation diagram is a non-uniform 16-QAM:

Constellation point Complex symbol 0 0.2592+0.4888i 1
0.4888+0.2592i 2 0.5072+1.1980i 3 1.1980+0.5072i
4−0.2592+0.4888i 5−0.4888+0.2592i 6−0.5072+
1.1980i 7−1.1980+0.5072i 8 0.2592−0.4888i 9
0.4888−0.2592i 10 0.5072−1.1980i 11 1.1980−0.5072i
12−0.2592−0.4888i 13−0.4888−0.2592i 14−0.5072−
1.1980i 15−1.1980−0.5072i.

6. The improved method of interleaving and mapping for an LDPC codeword of claim 1, characterized in that the LDPC code table corresponds to the LDPC code with a code length of 16200 bits and a code rate of 4/15;

the LDPC code table is:

M1=1080, M2=10800, L×L=360×360 19 585 710 3241
3276 3648 6345 9224 9890 10841 181 494 894 2562
3201 4382 5130 5308 6493 10135 150 569 919 1427
2347 4475 7857 8904 9903 1005 1018 1025 2933 3280
3946 4049 4166 5209 420 554 778 6908 7959 8344
8462 10912 11099 231 506 859 4478 4957 7664 7731
7908 8980 179 537 979 3717 5092 6315 6883 9353

9935 147 205 830 3609 3720 4667 7441 10196 11809
60 1021 1061 1554 4918 5690 6184 7986 11296 145
719 768 2290 2919 7272 8561 9145 10233 388 590 852
1579 1698 1974 9747 10192 10255 231 343 485 1546
3155 4829 7710 10394 11336 4381 5398 5987 9123
10365 11018 11153 2381 5196 6613 6844 7357 8732
11082 1730 4599 5693 6318 7626 9231 10663 the corresponding permutation order (bit-swapping pattern) is:

0 2 4 6 8 10 12 14 16 18 20 22 24 26 28 30 32 34 36 38
40 42 1 3 5 7 9 11 13 15 17 19 21 23 25 27 29 31 33
35 37 39 41 43 44 and the corresponding constellation diagram is QPSK:

Constellation point Complex symbol 0 1+i 1 1−i 2 −1+i 3 −1−i.

7. The improved method of interleaving and mapping for an LDPC codeword of claim 1, characterized in that the LDPC code table corresponds to the LDPC code with a code length of 16200 bits and a code rate of 8/15;

the LDPC code table is:

M1=7560, M2=0, L×L=360×360 5 519 825 1871 2098
2478 2659 2820 3200 3294 3650 3804 3949 4426 4460
4503 4568 4590 4949 5219 5662 5738 5905 5911 6160
6404 6637 6708 6737 6814 7263 7412 81 391 1272
1633 2062 2882 3443 3503 3535 3908 4033 4163 4490
4929 5262 5399 5576 5768 5910 6331 6430 6844 6867
7201 7274 7290 7343 7350 7378 7387 7440 7554 105
975 3421 3480 4120 4444 5957 5971 6119 6617 6761
6810 7067 7353 6 138 485 1444 1512 2615 2990 3109
5604 6435 6513 6632 6704 7507 20 858 1051 2539
3049 5162 5308 6158 6391 6604 6744 7071 7195 7238
1140 5838 6203 6748 6282 6466 6481 6638 2346 2592
5436 7487 2219 3897 5896 7528 2897 6028 7018 1285
1863 5324 3075 6005 6466 5 6020 7551 2121 3751
7507 4027 5488 7542 2 6012 7011 3823 5531 5687
1379 2262 5297 1882 7498 7551 3749 4806 7227 2
2074 6898 17 616 7482 9 6823 7480 5195 5880 7559 the corresponding permutation order (bit-swapping pattern) is:

0 2 4 6 8 10 12 14 16 18 20 22 24 26 28 30 32 34 36 38
40 42 1 3 5 7 9 11 13 15 17 19 21 23 25 27 29 31 33
35 37 39 41 43 44 and the corresponding constellation diagram is QPSK:

Constellation point Complex symbol 0 1+i 1 1−i 2 −1+i 3 −1−i.

8. The improved method of interleaving and mapping for an LDPC codeword of claim 1, characterized in that the LDPC code table corresponds to the LDPC code with a code length of 16200 bits and a code rate of 11/15;

the LDPC code table is:

M1=4320, M2=0, L×L=360×360 49 719 784 794 968
2382 2685 2873 2974 2995 3540 4179 272 281 374
1279 2034 2067 2112 3429 3613 3815 3838 4216 206
714 820 1800 1925 2147 2168 2769 2806 3253 3415
4311 62 159 166 605 1496 1711 2652 3016 3347 3517
3654 4113 363 733 1118 2062 2613 2736 3143 3427
3664 4100 4157 4314 57 142 436 983 1364 2105 2113
3074 3639 3835 4164 4242 870 921 950 1212 1861
2128 2707 2993 3730 3968 3983 4227 185 2684 3263
2035 2123 2913 883 2221 3521 1344 1773 4132 438
3178 3650 543 756 1639 1057 2337 2898 171 3298
3929 1626 2960 3503 484 3050 3323 2283 2336 4189
2732 4132 4318 225 2335 3497 600 2246 2658 1240
2790 3020 301 1097 3539 1222 1267 2594 1364 2004
3603 1142 1185 2147 564 1505 2086 697 991 2908
1467 2073 3462 2574 2818 3637 748 2577 2772 1151
1419 4129 164 1238 3401 the corresponding permutation order (bit-swapping pattern) is:

0 2 4 6 8 10 12 14 16 18 20 22 24 26 28 30 32 34 36 38
40 42 1 3 5 7 9 11 13 15 17 19 21 23 25 27 29 31 33
35 37 39 41 43 44 and the corresponding constellation diagram is QPSK:

Constellation point Complex symbol 0 1+i 1 1−i 2 −1+i 3 −1−i.

9. The improved method of interleaving and mapping for an LDPC codeword of claim 1, characterized in that the LDPC code table corresponds to the LDPC code with a code length of 16200 bits and a code rate of 12/15;

the LDPC code table is:

M1=3240, M2=0, L×L=360×360 3 394 1014 1214 1361
1477 1534 1660 1856 2745 2987 2991 3124 3155 59
136 528 781 803 928 1293 1489 1944 2041 2200 2613
2690 2847 155 245 311 621 1114 1269 1281 1783 1995
2047 2672 2803 2885 3014 79 870 974 1326 1449 1531
2077 2317 2467 2627 2811 3083 3101 3132 4 582 660
902 1048 1482 1697 1744 1928 2628 2699 2728 3045
3104 175 395 429 1027 1061 1068 1154 1168 1175
2147 2359 2376 2613 2682 1388 2241 3118 3148 143
506 2067 3148 1594 2217 2705 398 988 2551 1149
2588 2654 678 2844 3115 1508 1547 1954 1199 1267
1710 2589 3163 3207 1 2583 2974 2766 2897 3166 929
1823 2742 1113 3007 3239 1753 2478 3127 0 509 1811
1672 2646 2984 965 1462 3230 3 1077 2917 1183 1316
1662 968 1593 3239 64 1996 2226 1442 2058 3181 513
973 1058 1263 3185 3229 681 1394 3017 419 2853
3217 3 2404 3175 2417 2792 2854 1879 2940 3235 647
1704 3060 the corresponding permutation order (bit-swapping pattern) is:

0 2 4 6 8 10 12 14 16 18 20 22 24 26 28 30 32 34 36 38
40 42 1 3 5 7 9 11 13 15 17 19 21 23 25 27 29 31 33
35 37 39 41 43 44 and the corresponding constellation diagram is QPSK:

Constellation point Complex symbol 0 1+i 1 1−i 2 −1+i 3 −1−i.

10. The improved method of interleaving and mapping for an LDPC codeword of claim 1, characterized in that the LDPC code table corresponds to the LDPC code with a code length of 16200 bits and a code rate of 8/15;

the LDPC code table is:

M1=7560, M2=0, L×L=360×360 5 519 825 1871 2098
2478 2659 2820 3200 3294 3650 3804 3949 4426 4460
4503 4568 4590 4949 5219 5662 5738 5905 5911 6160
6404 6637 6708 6737 6814 7263 7412 81 391 1272
1633 2062 2882 3443 3503 3535 3908 4033 4163 4490
4929 5262 5399 5576 5768 5910 6331 6430 6844 6867
7201 7274 7290 7343 7350 7378 7387 7440 7554 105
975 3421 3480 4120 4444 5957 5971 6119 6617 6761
6810 7067 7353 6 138 485 1444 1512 2615 2990 3109
5604 6435 6513 6632 6704 7507 20 858 1051 2539
3049 5162 5308 6158 6391 6604 6744 7071 7195 7238
1140 5838 6203 6748 6282 6466 6481 6638 2346 2592
5436 7487 2219 3897 5896 7528 2897 6028 7018 1285
1863 5324 3075 6005 6466 5 6020 7551 2121 3751
7507 4027 5488 7542 2 6012 7011 3823 5531 5687
1379 2262 5297 1882 7498 7551 3749 4806 7227 2
2074 6898 17 616 7482 9 6823 7480 5195 5880 7559 the corresponding permutation order (bit-swapping pattern) is:

36 5 22 26 1 13 3 33 9 6 23 20 35 10 17 41 30 15 21 42
29 11 37 4 2 38 44 0 18 19 8 31 28 43 14 34 32 25 40
12 16 24 39 27 7 and the corresponding constellation diagram is a non-uniform 16-QAM:

Constellation point Complex symbol 0 0.2535+0.4923i 1 0.4923+0.2535i 2 0.4927+1.2044i 3 1.2044+0.4927i 4 −0.2535+0.4923i 5 −0.4923+0.2535i 6 −0.4927+1.2044i 7 −1.2044+0.4927i 8 0.2535−0.4923i 9 0.4923−0.2535i 10 0.4927−1.2044i 11 1.2044−0.4927i 12 −0.2535−0.4923i 13 −0.4923−0.2535i 14 −0.4927−1.2044i 15 −1.2044−0.4927i.

11. The improved method of interleaving and mapping for an LDPC codeword of claim 1, characterized in that when a code length is 16200, the first part and the second part respectively have 15840 bits and 360 bits after the second bit interleaving.

12. The improved method of interleaving and mapping for an LDPC codeword of claim 1, characterized in that when a code length is 64800, the first part and the second part respectively have 64800 bits and 0 bits after the second bit interleaving.

13. The improved method of interleaving and mapping for an LDPC codeword of claim 1, characterized in that when the mode of the constellation mapping is QPSK, the number of columns is two.

14. The improved method of interleaving and mapping for an LDPC codeword of claim 1, characterized in that when the mode of the constellation mapping is a non-uniform 16-QAM, the number of columns is four.

15. An improved method of deinterleaving and demapping for an LDPC codeword, characterized by comprising the steps of:
soft-demapping, with a processor, a symbol stream received by a receiving end according to a corresponding constellation diagram to obtain first soft bit value data; wherein the symbol stream is generated by means of the interleaving and mapping method for an LDPC codeword as claimed in claim 1;
dividing, with a processor, the first soft bit value data into a first part and a second part and writing the two parts into a storage space in a row order respectively and reading the two parts from the storage space in a column order respectively, and splicing the two reading results to obtain second soft bit value data after first bit deinterleaving;
dividing, with a processor, the second soft bit value data after the first bit deinterleaving into multiple consecutive soft bit value data subblocks with a predetermined length, and changing the order of the soft bit value data subblocks according to a corresponding permutation order (bit-swapping pattern) to form a third soft bit value data after second bit deinterleaving;
dividing, with a processor, the third soft bit value data corresponding to a check part of the LDPC codeword after the second bit deinterleaving into the first check part M1 soft bit value data and the second check part M2 soft bit value data and performing a third bit deinterleaving on the first check part M1 soft bit value data and the second check part M2 soft bit value data, separately, to obtain a fourth soft bit value data after third bit deinterleaving;
splicing, with a processor, the fourth soft bit value data corresponding to an information bit part of the LDPC codeword after the second bit deinterleaving and the fourth soft bit value data after the third bit deinterleaving into a soft bit value data stream; and
performing, with a processor, LDPC decoding on the soft bit value data stream to obtain decoded bit stream data.

16. The improved method of deinterleaving and demapping for an LDPC codeword of claim 15, characterized in that when a code length is 16200, the length of the first part of the soft bit value is 15840 and the length of the second part of the soft bit value is 360.

17. The improved method of deinterleaving and demapping for an LDPC codeword of claim 15, characterized in that when a code length is 64800, the length of the first part of the soft bit value is 64800 and the length of the second part of the soft bit value is 0.

18. The improved method of deinterleaving and demapping for an LDPC codeword of claim 15, characterized in that when the mode of the constellation mapping is QPSK, the number of columns in the column order is two.

19. The improved method of deinterleaving and demapping for an LDPC codeword of claim 15, characterized in that when the mode of the constellation mapping is a non-uniform 16-QAM, the number of columns in the column order is four.

20. The improved method of deinterleaving and demapping for an LDPC codeword of claim 15, characterized in that
dividing, with a processor, the third soft bit value data corresponding to a check part of the LDPC codeword after the second bit deinterleaving into the first check part M1 soft bit value data and the second check part M2 soft bit value data and performing the third bit deinterleaving on the first check part M1 soft bit value data and the second check part M2 soft bit value data, separately, to obtain the fourth soft bit value data after the third bit deinterleaving comprises:
writing the first check part of soft bit value data into a storage space in a row order, with each row having $$Q1=M1/360$$

soft bit value data and there being L=360 columns in total, and then reading the first check part in a column order; writing the second check part of M2 soft bit value data into a storage space in a row order, with each column having $$Q2=M2/360$$

bits and there being L=360 columns in total, and then reading the second check part in a column order; and finally splicing the two parts of soft bit value data to obtain soft bit value data after the third bit deinterleaving.

21. The improved method of interleaving and mapping for an LDPC codeword of claim 1, characterized in that M2 is zero or M2 is not zero.

22. The improved method of deinterleaving and demapping for an LDPC codeword of claim 15, characterized in that M2 is zero or M2 is not zero.

23. A transmitter, comprising an interleaving module and a constellation mapping module, characterized in that:
the interleaving module is configured to perform a first bit interleaving on a check part of a first LDPC codeword to obtain a check bit stream, wherein the check part of the first LDPC codeword includes a first part having M1 bits and a second part having M2 bits, and the first bit interleaving is performed separately on the first part and the second part;
the interleaving module is configured to splice an information bit part of the first LDPC codeword and the check bit stream into a second LDPC codeword after first bit interleaving;

the interleaving module is configured to divide the second LDPC codeword after the first bit interleaving into multiple consecutive bit subblocks with a predetermined bit length, and change the order of the bit subblocks according to a corresponding permutation order to form a third LDPC codeword after second bit interleaving;

the interleaving module is configured to divide the third LDPC codeword after the second bit interleaving into two parts, write a first part into a storage space in a column order and reading the first part from the storage space in a row order, then write a second part into a storage space in a column order and read the second part from the storage space in a row order, and splice the two read results to obtain a fourth LDPC codeword after third bit interleaving; and the constellation mapping module is configured to perform constellation mapping on the fourth LDPC codeword after the third bit interleaving according to a corresponding constellation diagram to obtain a symbol stream; the permutation orders and the constellation diagrams used in the interleaving and mapping processing of LDPC codes with different code rates, code length, and LDPC code tables are designed and optimized using theoretical analysis.

24. The transmitter, comprising an interleaving module and a constellation mapping module, of claim 23, characterized in that performing first bit interleaving on a check part of the LDPC codeword to obtain a check bit stream comprises:

the first part $M_1$ bits written into a storage space in columns, with each column having $$Q_1 = \frac{M_1}{360}$$

bits and there being L=360 columns in total, and then the first part $M_1$ bits read in a row order; and the second part $M_2$ bits written into a storage space in columns, with each column having $$Q_2 = \frac{M_2}{360}$$

bits and there being L=360 columns in total, and then the second part $M_2$ bits read in a row order, so that the check bit stream is obtained.

25. The transmitter, comprising an interleaving module and a constellation mapping module, of claim 23, characterized in that the predetermined bit length of the bit subblock is 360 bits.

26. The transmitter, comprising an interleaving module and a constellation mapping module, of claim 23, characterized in that the LDPC code table corresponds to the LDPC code with a code length of 64800 bits and a code rate of 4/15;

the LDPC code table is:
M1=1800, M2=45720, L×L=360×360 276 1754 1780 3597 8549 15196 26305 27003 33883 37189 41042 41849 42356 730 873 927 9310 9867 17594 21969 25106 25922 31167 35434 37742 45866 925 1202 1564 2575 2831 2951 5193 13096 18363 20592 33786 34090 40900 973 1045 1071 8545 8980 11983 18649 21323 22789 22843 26821 36720 37856 402 1038 1689 2466 2893 13474 15710 24137 29709 30451 35568 35966 46436 263 271 395 5089 5645 15488 16314 28778 29729 34350 34533 39608 45371 387 1059 1306 1955 6990 20001 24606 28167 33802 35181 38481 38688 45140 53 851 1750 3493 11415 18882 20244 23411 28715 30722 36487 38019 45416 810 1044 1772 3906 5832 16793 17333 17910 23946 29650 34190 40673 45828 97 491 948 12156 13788 24970 33774 37539 39750 39820 41195 46464 46820 192 899 1283 3732 7310 13637 13810 19005 24227 26772 31273 37665 44005 424 531 1300 4860 8983 10137 16323 16888 17933 22458 26917 27835 37931 130 279 731 3024 6378 18838 19746 21007 22825 23109 28644 32048 34667 938 1041 1482 9589 10065 11535 17477 25816 27966 35022 35025 42536 170 454 1312 5326 6765 23408 24090 26072 33037 38088 42985 46413 220 804 843 2921 4841 7760 8303 11259 21058 21276 34346 37604 676 713 832 11937 12006 12309 16329 26438 34214 37471 38179 42420 714 931 1580 6837 9824 11257 15556 26730 32053 34461 35889 45821 28 1097 1340 8767 9406 17253 29558 32857 37856 38593 41781 47101 158 722 754 14489 23851 28160 30371 30579 34963 44216 46462 47463 833 1326 1332 7032 9566 11011 21424 26827 29789 31699 32876 37498 251 504 1075 4470 7736 11242 20397 32719 34453 36571 40344 46341 330 581 868 15168 20265 26354 33624 35134 38609 44965 45209 46909 729 1643 1732 3946 4912 9615 19699 30993 33658 38712 39424 46799 546 982 1274 9264 11017 11868 15674 16277 19204 28606 39063 43331 73 1160 1196 4334 12560 13583 14703 18270 18719 19327 38985 46779 1147 1625 1759 3767 5912 11599 18561 19330 29619 33671 43346 44098 104 1507 1586 9387 17890 23532 27008 27861 30966 33579 35541 39801 1700 1746 1793 4941 7814 13746 20375 27441 30262 30392 35385 42848 183 555 1029 3090 5412 8148 19662 23312 23933 28179 29962 35514 891 908 1127 2827 4077 4376 4570 26923 27456 33699 43431 46071 404 1110 1782 6003 14452 19247 26998 30137 31404 31624 46621 47366 886 1627 1704 8193 8980 9648 10928 16267 19774 35111 38545 44735 268 380 1214 4797 5168 9109 9288 17992 21309 33210 36210 41429 572 1121 1165 6944 7114 20978 23540 25863 26190 26365 41521 44690 18 185 496 5885 6165 20468 23895 24745 31226 33680 37665 38587 289 527 1118 11275 12015 18088 22805 24679 28262 30160 34892 43212 658 926 1589 7634 16231 22193 25320 26057 26512 27498 29472 34219 337 801 1525 2023 3512 16031 26911 32719 35620 39035 43779 44316 248 534 670 6217 11430 24090 26509 28712 33073 33912 38048 39813 82 1556 1575 7879 7892 14714 22404 22773 25531 34170 38203 38254 247 313 1224 3694 14304 24033 26394 28101 37455 37859 38997 41344 790 887 1418 2811 3288 9049 9704 13303 14262 38149 40109 40477 1310 1384 1471 3716 8250 25371 26329 26997 30138 40842 41041 44921 86 288 367 1860 8713 18211 22628 22811 28342 28463 40415 45845 719 1438 1741 8258 10797 29270 29404 32096 34433 34616 36030 45597 215 1182 1364 8146 9949 10498 18603 19304 19803 23685 43304 45121 1243 1496 1537 8484 8851 16589 17665 20152 24283 28993 34274 39795 6320 6785 15841 16309 20512 25804 27421 28941 43871 44647 2207 2713 4450 12217 16506 21188 23933 28789 38099 42392 14064 14307 14599 14866 17540 18881 21065 25823 30341 36963 14259 14396 17037 26769 29219 29319 31689 33013

35631 37319 7798 10495 12868 14298 17221 23344 31908 39809 41001 41965 the corresponding permutation order (bit-swapping pattern) is:

165 8 136 2 58 30 127 64 38 164 123 45 78 17 47 105 159 134 124 147 148 109 67 98 157 57 156 170 46 12 172 29 9 3 144 97 83 151 26 52 10 39 50 104 92 163 72 125 36 14 55 48 1 149 33 110 6 130 140 89 77 22 171 139 112 113 152 16 7 85 11 28 153 73 62 44 135 116 4 61 117 53 111 178 94 81 68 114 173 75 101 88 65 99 126 141 43 15 18 90 35 24 142 25 120 19 154 0 174 93 167 150 107 86 129 175 87 21 66 106 82 179 118 41 95 145 37 23 168 166 49 103 108 56 91 69 128 121 96 133 100 161 143 119 102 59 20 40 70 79 80 51 13 177 131 132 176 155 31 63 5 162 76 42 160 115 71 158 54 137 146 32 169 122 138 84 74 60 34 27 and the corresponding constellation diagram is a non-uniform 16-QAM:

Constellation point Complex symbol 0 0.3412+0.5241i 1 0.5241+0.3412i 2 0.5797+1.1282i 3 1.1282+0.5797i 4 −0.3412+0.5241i 5 −0.5241+0.3412i 6 −0.5797+1.1282i 7 −1.1282+0.5797i 8 0.3412−0.5241i 9 0.5241−0.3412i 10 0.5797−1.1282i 11 1.1282−0.5797i 12 −0.3412−0.5241i 13 −0.5241−0.3412i 14 −0.5797−1.1282i 15 −1.1282−0.5797i.

27. The transmitter, comprising an interleaving module and a constellation mapping module, of claim 23, characterized in that the LDPC code table corresponds to the LDPC code with a code length of 64800 bits and a code rate of 7/15;

the LDPC code table is:

M1=1080, M2=33480, L×L=360×360 460 792 1007 4580 11452 13130 26882 27020 32439 35 472 1056 7154 12700 13326 13414 16828 19102 45 440 772 4854 7863 26945 27684 28651 31875 744 812 892 1509 9018 12925 14140 21357 25106 271 474 761 4268 6706 9609 19701 19707 24870 223 477 662 1987 9247 18376 22148 24948 27694 44 379 786 8823 12322 14666 16377 28688 29924 104 219 562 5832 19665 20615 21043 22759 32180 41 43 870 7963 13718 14136 17216 30470 33428 592 744 887 4513 6192 18116 19482 25032 34095 456 821 1078 7162 7443 8774 15567 17243 33085 151 666 977 6946 10358 11172 18129 19777 32234 236 793 870 2001 6805 9047 13877 30131 34252 297 698 772 3449 4204 11608 22950 26071 27512 202 428 474 3205 3726 6223 7708 20214 25283 139 719 915 1447 2938 11864 15932 21748 28598 135 853 902 3239 18590 20579 30578 33374 34045 9 13 971 11834 13642 17628 21669 24741 30965 344 531 730 1880 16895 17587 21901 28620 31957 7 192 380 3168 3729 5518 6827 20372 34168 28 521 681 4313 7465 14209 21501 23364 25980 269 393 898 3561 11066 11985 17311 26127 30309 42 82 707 4880 4890 9818 23340 25959 31695 189 262 707 6573 14082 22259 24230 24390 24664 383 568 573 5498 13449 13990 16904 22629 34203 585 596 820 2440 2488 21956 28261 28703 29591 755 763 795 5636 16433 21714 23452 31150 34545 23 343 669 1159 3507 13096 17978 24241 34321 316 384 944 4872 8491 18913 21085 23198 24798 64 314 765 3706 7136 8634 14227 17127 23437 220 693 899 8791 12417 13487 18335 22126 27428 285 794 1045 8624 8801 9547 19167 21894 32657 386 621 1045 1634 1882 3172 13686 16027 22448 95 622 693 2827 7098 11452 14112 18831 31308 446 813 928 7976 8935 13146 27117 27766 33111 89 138 241 3218 9283 20458 31484 31538 34216 277 420 704 9281

12576 12788 14496 15357 20585 141 643 758 4894 10264 15144 16357 22478 26461 17 108 160 13183 15424 17939 19276 23714 26655 109 285 608 1682 20223 21791 24615 29622 31983 123 515 622 7037 13946 15292 15606 16262 23742 264 565 923 6460 13622 13934 23181 25475 26134 202 548 789 8003 10993 12478 16051 25114 27579 121 450 575 5972 10062 18693 21852 23874 28031 507 560 889 12064 13316 19629 21547 25461 28732 664 786 1043 9137 9294 10163 23389 31436 34297 45 830 907 10730 16541 21232 30354 30605 31847 203 507 1060 6971 12216 13321 17861 22671 29825 369 881 952 3035 12279 12775 17682 17805 34281 683 709 1032 3787 17623 24138 26775 31432 33626 524 792 1042 12249 14765 18601 25811 32422 33163 137 639 688 7182 8169 10443 22530 24597 29039 159 643 749 16386 17401 24135 28429 33468 33469 107 481 555 7322 13234 19344 23498 26581 31378 249 389 523 3421 10150 17616 19085 20545 32069 395 738 1045 2415 3005 3820 19541 23543 31068 27 293 703 1717 3460 8326 8501 10290 32625 126 247 515 6031 9549 10643 22067 29490 34450 331 471 1007 3020 3922 7580 23358 28620 30946 222 542 1021 3291 3652 13130 16349 33009 34348 532 719 1038 5891 7528 23252 25472 31395 31774 145 398 774 7816 13887 14936 23708 31712 33160 88 536 600 1239 1887 12195 13782 16726 27998 151 269 585 1445 3178 3970 15568 20358 21051 650 819 865 15567 18546 25571 32038 33350 33620 93 469 800 6059 10405 12296 17515 21354 22231 97 206 951 6161 16376 27022 29192 30190 30665 412 549 986 5833 10583 10766 24946 28878 31937 72 604 659 5267 12227 21714 32120 33472 33974 25 902 912 1137 2975 9642 11598 25919 28278 420 976 1055 8473 11512 20198 21662 25443 30119 1 24 932 6426 11899 13217 13935 16548 29737 53 618 988 6280 7267 11676 13575 15532 25787 111 739 809 8133 12717 12741 20253 20608 27850 120 683 943 14496 15162 15440 18660 27543 32404 600 754 1055 7873 9679 17351 27268 33508 344 756 1054 7102 7193 22903 24720 27883 582 1003 1046 11344 23756 27497 27977 32853 28 429 509 11106 11767 12729 13100 31792 131 555 907 5113 10259 10300 20580 23029 406 915 977 12244 20259 26616 27899 32228 46 195 224 1229 4116 10263 13608 17830 19 819 953 7965 9998 13959 30580 30754 164 1003 1032 12920 15975 16582 22624 27357 8433 11894 13531 17675 25889 31384 3166 3813 8596 10368 25104 29584 2466 8241 12424 13376 24837 32711 the corresponding permutation order (bit-swapping pattern) is:

174 148 56 168 38 7 110 9 42 153 160 15 46 21 121 88 114 85 13 83 74 81 70 27 119 118 144 31 80 109 73 141 93 45 16 77 108 57 36 78 124 79 169 143 6 58 75 67 5 104 125 140 172 8 39 17 29 159 86 87 41 99 89 47 128 43 161 154 101 163 116 94 120 71 158 145 37 112 68 95 1 113 64 72 90 92 35 167 44 149 66 28 82 178 176 152 23 115 130 98 123 102 24 129 150 34 136 171 54 107 2 3 60 69 10 117 91 157 33 105 155 62 162 40 127 14 165 26 52 19 48 137 4 22 122 173 18 11 111 106 76 53 61 147 97 175 32 59 166 179 135 177 103 100 139 50 146 134 133 96 49 126 151 84 156 30 138 164 132 12 0 20 63 170 142 65 55 25 51 131 and the corresponding constellation diagram is a non-uniform 16-QAM:

Constellation point Complex symbol 0 0.2592+0.4888i 1 0.4888+0.2592i 2 0.5072+1.1980i 3 1.1980+0.5072i 4 −0.2592+0.4888i   5 −0.4888+0.2592i   6 −0.5072+1.1980i   7 −1.1980+0.5072i   8  0.2592−0.4888i   9  0.4888−0.2592i   10  0.5072−1.1980i   11  1.1980−0.5072i   12 −0.2592−0.4888i   13 −0.4888−0.2592i   14 −0.5072−1.1980i   15 −1.1980−0.5072i.

28. The transmitter, comprising an interleaving module and a constellation mapping module, of claim 23, characterized in that the LDPC code table corresponds to the LDPC code with a code length of 16200 bits and a code rate of 4/15;

the LDPC code table is:

M1=1080, M2=10800, L×L=360×360 19 585 710 3241 3276 3648 6345 9224 9890 10841 181 494 894 2562 3201 4382 5130 5308 6493 10135 150 569 919 1427 2347 4475 7857 8904 9903 1005 1018 1025 2933 3280 3946 4049 4166 5209 420 554 778 6908 7959 8344 8462 10912 11099 231 506 859 4478 4957 7664 7731 7908 8980 179 537 979 3717 5092 6315 6883 9353 9935 147 205 830 3609 3720 4667 7441 10196 11809 60 1021 1061 1554 4918 5690 6184 7986 11296 145 719 768 2290 2919 7272 8561 9145 10233 388 590 852 1579 1698 1974 9747 10192 10255 231 343 485 1546 3155 4829 7710 10394 11336 4381 5398 5987 9123 10365 11018 11153 2381 5196 6613 6844 7357 8732 11082 1730 4599 5693 6318 7626 9231 10663 the corresponding permutation order (bit-swapping pattern) is:

0 2 4 6 8 10 12 14 16 18 20 22 24 26 28 30 32 34 36 38 40 42 1 3 5 7 9 11 13 15 17 19 21 23 25 27 29 31 33 35 37 39 41 43 44 and the corresponding constellation diagram is QPSK:

Constellation point Complex symbol 0 1+i 1 1−i 2 −1+i 3 −1−i.

29. The transmitter, comprising an interleaving module and a constellation mapping module, of claim 23, characterized in that the LDPC code table corresponds to the LDPC code with a code length of 16200 bits and a code rate of 8/15;

the LDPC code table is:

M1=7560, M2=0, L×L=360×360 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412 81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554 105 975 3421 3480 4120 4444 5957 5971 6119 6617 6761 6810 7067 7353 6 138 485 1444 1512 2615 2990 3109 5604 6435 6513 6632 6704 7507 20 858 1051 2539 3049 5162 5308 6158 6391 6604 6744 7071 7195 7238 1140 5838 6203 6748 6282 6466 6481 6638 2346 2592 5436 7487 2219 3897 5896 7528 2897 6028 7018 1285 1863 5324 3075 6005 6466 5 6020 7551 2121 3751 7507 4027 5488 7542 2 6012 7011 3823 5531 5687 1379 2262 5297 1882 7498 7551 3749 4806 7227 2 2074 6898 17 616 7482 9 6823 7480 5195 5880 7559 the corresponding permutation order (bit-swapping pattern) is:

0 2 4 6 8 10 12 14 16 18 20 22 24 26 28 30 32 34 36 38 40 42 1 3 5 7 9 11 13 15 17 19 21 23 25 27 29 31 33 35 37 39 41 43 44 and the corresponding constellation diagram is QPSK:

Constellation point Complex symbol 0 1+i 1 1−i 2 −1+i 3 −1−i.

30. The transmitter, comprising an interleaving module and a constellation mapping module, of claim 23, characterized in that the LDPC code table corresponds to the LDPC code with a code length of 16200 bits and a code rate of 11/15;

the LDPC code table is:

M1=4320, M2=0, L×L=360×360 49 719 784 794 968 2382 2685 2873 2974 2995 3540 4179 272 281 374 1279 2034 2067 2112 3429 3613 3815 3838 4216 206 714 820 1800 1925 2147 2168 2769 2806 3253 3415 4311 62 159 166 605 1496 1711 2652 3016 3347 3517 3654 4113 363 733 1118 2062 2613 2736 3143 3427 3664 4100 4157 4314 57 142 436 983 1364 2105 2113 3074 3639 3835 4164 4242 870 921 950 1212 1861 2128 2707 2993 3730 3968 3983 4227 185 2684 3263 2035 2123 2913 883 2221 3521 1344 1773 4132 438 3178 3650 543 756 1639 1057 2337 2898 171 3298 3929 1626 2960 3503 484 3050 3323 2283 2336 4189 2732 4132 4318 225 2335 3497 600 2246 2658 1240 2790 3020 301 1097 3539 1222 1267 2594 1364 2004 3603 1142 1185 2147 564 1505 2086 697 991 2908 1467 2073 3462 2574 2818 3637 748 2577 2772 1151 1419 4129 164 1238 3401 the corresponding permutation order (bit-swapping pattern) is:

0 2 4 6 8 10 12 14 16 18 20 22 24 26 28 30 32 34 36 38 40 42 1 3 5 7 9 11 13 15 17 19 21 23 25 27 29 31 33 35 37 39 41 43 44 and the corresponding constellation diagram is QPSK:

Constellation point Complex symbol 0 1+i 1 1−i 2 −1+i 3 −1−i.

31. The transmitter, comprising an interleaving module and a constellation mapping module, of claim 23, characterized in that the LDPC code table corresponds to the LDPC code with a code length of 16200 bits and a code rate of 12/15;

the LDPC code table is:

M1=3240, M2=0, L×L=360×360 3 394 1014 1214 1361 1477 1534 1660 1856 2745 2987 2991 3124 3155 59 136 528 781 803 928 1293 1489 1944 2041 2200 2613 2690 2847 155 245 311 621 1114 1269 1281 1783 1995 2047 2672 2803 2885 3014 79 870 974 1326 1449 1531 2077 2317 2467 2627 2811 3083 3101 3132 4 582 660 902 1048 1482 1697 1744 1928 2628 2699 2728 3045 3104 175 395 429 1027 1061 1068 1154 1168 1175 2147 2359 2376 2613 2682 1388 2241 3118 3148 143 506 2067 3148 1594 2217 2705 398 988 2551 1149 2588 2654 678 2844 3115 1508 1547 1954 1199 1267 1710 2589 3163 3207 1 2583 2974 2766 2897 3166 929 1823 2742 1113 3007 3239 1753 2478 3127 0 509 1811 1672 2646 2984 965 1462 3230 3 1077 2917 1183 1316 1662 968 1593 3239 64 1996 2226 1442 2058 3181 513 973 1058 1263 3185 3229 681 1394 3017 419 2853 3217 3 2404 3175 2417 2792 2854 1879 2940 3235 647 1704 3060 the corresponding permutation order (bit-swapping pattern) is:

0 2 4 6 8 10 12 14 16 18 20 22 24 26 28 30 32 34 36 38 40 42 1 3 5 7 9 11 13 15 17 19 21 23 25 27 29 31 33 35 37 39 41 43 44 and the corresponding constellation diagram is QPSK:

Constellation point Complex symbol 0 1+i 1 1−i 2 −1+i 3 −1−i.

32. The transmitter, comprising an interleaving module and a constellation mapping module, of claim 23, characterized in that the LDPC code table corresponds to the LDPC code with a code length of 16200 bits and a code rate of 8/15;

the LDPC code table is:

M1=7560, M2=0, L×L=360×360 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412 81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554 105 975 3421 3480 4120 4444 5957 5971 6119 6617 6761 6810 7067 7353 6 138 485 1444 1512 2615 2990 3109 5604 6435 6513 6632 6704 7507 20 858 1051 2539 3049 5162 5308 6158 6391 6604 6744 7071 7195 7238 1140 5838 6203 6748 6282 6466 6481 6638 2346 2592 5436 7487 2219 3897 5896 7528 2897 6028 7018 1285 1863 5324 3075 6005 6466 5 6020 7551 2121 3751 7507 4027 5488 7542 2 6012 7011 3823 5531 5687 1379 2262 5297 1882 7498 7551 3749 4806 7227 2 2074 6898 17 616 7482 9 6823 7480 5195 5880 7559 the corresponding permutation order (bit-swapping pattern) is:

36 5 22 26 1 13 3 33 9 6 23 20 35 10 17 41 30 15 21 42 29 11 37 4 2 38 44 0 18 19 8 31 28 43 14 34 32 25 40 12 16 24 39 27 7 and the corresponding constellation diagram is a non-uniform 16-QAM:

Constellation point Complex symbol 0 0.2535+0.4923i 1 0.4923+0.2535i 2 0.4927+1.2044i 3 1.2044+0.4927i 4 −0.2535+0.4923i 5 −0.4923+0.2535i 6 −0.4927+1.2044i 7 −1.2044+0.4927i 8 0.2535−0.4923i 9 0.4923−0.2535i 10 0.4927−1.2044i 11 1.2044−0.4927i 12 −0.2535−0.4923i 13 −0.4923−0.2535i 14 −0.4927−1.2044i 15 −1.2044−0.4927i.

33. The transmitter, comprising an interleaving module and a constellation mapping module, of claim 23, characterized in that when a code length is 16200, the first part and the second part respectively have 15840 bits and 360 bits after the second bit interleaving.

34. The transmitter, comprising an interleaving module and a constellation mapping module, of claim 23, characterized in that when a code length is 64800, the first part and the second part respectively have 64800 bits and 0 bits after the second bit interleaving.

35. The transmitter, comprising an interleaving module and a constellation mapping module, of claim 23, characterized in that when the mode of the constellation mapping is QPSK, the number of columns is two.

36. The transmitter, comprising an interleaving module and a constellation mapping module, of claim 23, characterized in that when the mode of the constellation mapping is a non-uniform 16-QAM, the number of columns is four.

37. The transmitter, comprising an interleaving module and a constellation mapping module, of claim 23, characterized in that M2 is zero or M2 is not zero.

38. A receiver, comprising a deinterleaving module and a demapping module, characterized in that:

the demapping module is configured to soft-demap a symbol stream received by a receiving end according to a corresponding constellation diagram to obtain first soft bit value data; wherein the symbol stream is generated by means of the interleaving and mapping method for an LDPC codeword as claimed in claim 1;

the deinterleaving module is configured to divide the first soft bit value data into a first part and a second part and writing the two parts into a storage space in a row order respectively and reading the two parts from the storage space in a column order respectively, and splice the two reading results to obtain second soft bit value data after the first bit deinterleaving;

the deinterleaving module is configured to divide the second soft bit value data after the first bit deinterleaving into multiple consecutive soft bit value data sub-blocks with a predetermined length, and change the order of the soft bit value data subblocks according to a corresponding permutation order (bit-swapping pattern) to form third soft bit value data after second bit deinterleaving;

the deinterleaving module is configured to divide the third soft bit value data corresponding to a check part of the LDPC codeword after the second bit deinterleaving into a first check part M1 soft bit value data and a second check part M2 soft bit value data and perform a third bit deinterleaving on the first check part M1 soft bit value data and the second check part M2 soft bit value data, separately, to obtain fourth soft bit value data after the third bit deinterleaving;

the deinterleaving module is configured to splice the fourth soft bit value data corresponding to an information bit part of the LDPC codeword after the second bit deinterleaving and the fourth soft bit value data after the third bit deinterleaving into a soft bit value data stream; and the deinterleaving module is configured to perform LDPC decoding on the soft bit value data stream to obtain decoded bit stream data.

39. The receiver, comprising a deinterleaving module and a demapping module, of claim 38, characterized in that when a code length is 16200, the length of the first part of the soft bit value is 15840 and the length of the second part of the soft bit value is 360.

40. The receiver, comprising a deinterleaving module and a demapping module, of claim 38, characterized in that when a code length is 64800, the length of the first part of the soft bit value is 64800 and the length of the second part of the soft bit value is 0.

41. The receiver, comprising a deinterleaving module and a demapping module, of claim 38, characterized in that when the mode of the constellation mapping is QPSK, the number of columns in the column order is two.

42. The receiver, comprising a deinterleaving module and a demapping module, of claim 38, characterized in that when the mode of the constellation mapping is a non-uniform 16-QAM, the number of columns in the column order is four.

43. The receiver, comprising a deinterleaving module and a demapping module, of claim 38, characterized in that dividing, with a processor, the third soft bit value data corresponding to a check part of the LDPC codeword after the second bit deinterleaving into the first check part M1 soft bit value data and the second check part M2 soft bit value data and performing the third bit deinterleaving on the first check part M1 soft bit value data and the second check part M2 soft bit value data, separately, to obtain the fourth soft bit value data after the third bit deinterleaving comprises:

writing the first check part of soft bit value data into a storage space in a row order, with each row having $Q1=M1/360$ soft bit value data and there being L=360 columns in total, and then reading the first check part in a column order; writing the second check part of M2 soft bit value data into a storage space in a row order, with each column having $$Q2=M2/360$$

bits and there being L=360 columns in total, and then reading the second check part in a column order; and finally splicing the two parts of soft bit value data to obtain soft bit value data after the third bit deinterleaving.

44. The receiver, comprising a deinterleaving module and a demapping module, of claim 38, characterized in that M2 is zero or M2 is not zero.

* * * * *